United States Patent [19]
Sato et al.

[11] Patent Number: 5,197,118
[45] Date of Patent: Mar. 23, 1993

[54] CONTROL SYSTEM FOR A FINE PATTERN PRINTING APPARATUS

[75] Inventors: Ryuichi Sato; Masanori Numata; Bunei Hamasaki, all of Yokohama; Naoki Ayata, Machida, all of Japan

[73] Assignee: Canon Kabushiki Kaisha, Tokyo, Japan

[21] Appl. No.: 752,986

[22] Filed: Sep. 3, 1991

Related U.S. Application Data

[63] Continuation of Ser. No. 637,941, Jan. 8, 1991, abandoned, which is a continuation of Ser. No. 888,490, Jul. 23, 1986, abandoned.

[30] Foreign Application Priority Data

| Jul. 25, 1985 | [JP] | Japan | 60-164798 |
| Jul. 25, 1985 | [JP] | Japan | 60-164799 |
| Jul. 25, 1985 | [JP] | Japan | 60-164800 |
| Jul. 25, 1985 | [JP] | Japan | 60-164801 |
| Jul. 25, 1985 | [JP] | Japan | 60-164802 |
| Jul. 25, 1985 | [JP] | Japan | 60-164803 |
| Jul. 25, 1985 | [JP] | Japan | 60-164804 |

[51] Int. Cl.⁵ .................. G06F 15/62; H01J 37/304
[52] U.S. Cl. ........................ 395/105; 355/53
[58] Field of Search ............ 395/105, 100, 101;
364/488–491, 188; 250/548, 492.2, 492.3;
378/34, 35; 356/401; 355/53

[56] References Cited

U.S. PATENT DOCUMENTS

| 3,955,072 | 5/1976 | Johannsmeier et al. | 364/490 X |
| 4,103,998 | 8/1978 | Nakazawa et al. | 364/490 X |
| 4,550,374 | 10/1985 | Meshman et al. | 364/490 |
| 4,621,371 | 11/1986 | Gotou et al. | 378/34 |
| 4,644,477 | 2/1987 | Kojima | 364/523 |
| 4,672,557 | 6/1987 | Tamura et al. | 364/490 |
| 4,679,153 | 7/1987 | Robinson et al. | 364/523 |

Primary Examiner—Heather R. Herndon
Attorney, Agent, or Firm—Fitzpatrick, Cella, Harper & Scinto

[57] ABSTRACT

A system for controlling operation of a fine pattern printing apparatus. The system including a command storing portion in which a plurality of unit-operation instructing commands capable of instructing execution of corresponding unit operations which are components of the pattern printing operation of the apparatus and at least one sequential operation instructing command including a combination of at least a predetermined portion of the unit-operation instructing commands are stored. A command selecting portion for allowing selection of the commands stored in the command storing portion; a sequence setting portion cooperative with the command selecting portion so as to set, in the command storing portion, a desired sequential operation instructing command formed by a plurality of unit-operation instructing commands each of which is stored in the command storing portion. The sequential operation instructing command set in the storing portion by the sequence setting portion is selectable by the command selecting portion and operation controlling portion cooperative with the command selecting portion so as to control the operation of the apparatus in accordance with such one of the commands stored in the storing portion that is selected by the selection portion.

18 Claims, 33 Drawing Sheets

```
       AUTO  SEQUENCE  FILE

1. FILE NAME      [Z MEASURE]  —41

2. COMMENT        [COMMENT n]  —42

3. EDITOR

SELECT NO. OR END   [3 )]  —43
```

F I G. 4A

```
       AUTO  SEQUENCE  FILE

S1

S2
 ⋮
Sm

SELECT STEP NO. OR END  [S1 )]  —44
```

F I G. 4B

```
       AUTO SEQUENCE FILE

S1    LOOP 10 (S2,S3)

S2    ZD (+0.5)

S3    FC

S4    END
```

FIG. 4C

```
       AUTO SEQUENCE FILE

1.  FILE NAME      Z MEASURE

2.  COMMENT        COMMENT 1

3.  EDITOR

SELECT NO. OR END   [E]
```

FIG. 4D

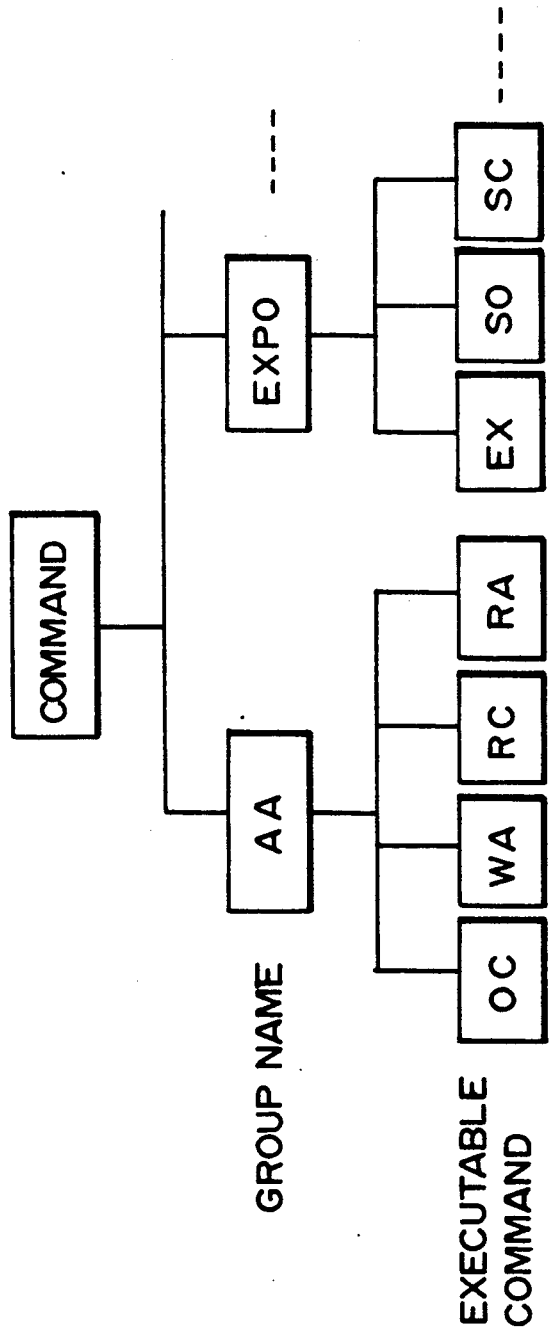
F I G. 7

```
Group    Definition

1. Group    Name    : AA
 2. Pass    Word    : Canon
 3. Comment         : MOS
 4. MEMBER
     (1) OC : Comment A
     (2) WA : Comment B
     (3) RC : Comment C Select  NO.  or  End      4
```

FIG. 9A

```
Group    Definition

1. Group    Name    : AA
 2. Pass    Word    : Canon
 3. Comment         : MOS
 4. MEMBER
     (1) OC : Comment A
     (2) WA : Comment B
     (3) RC : Comment C Select(O:ADD, I:DELETE, E:END)  O
```

FIG. 9B

```
Group Definition
1. Group Name    : AA
2. Pass Word     : Canon
3. Comment       : MOS
4. MEMBER
   (1) OC : Comment A
   (2) WA : Comment B
   (3) RC : Comment C ADD (4)    RA : Comment    D ↵
```

FIG. 9C

```
Group Definition
1. Group Name    : AA
2. Pass Word     : Canon
3. Comment       : MOS
4. MEMBER
   (1) OC : Comment A
   (2) WA : Comment B
   (3) RC : Comment C
   (4) RA : Comment D Select (0:ADD, 1:DELETE, E:END) E ↵
```

FIG. 9D

Select (0:ADD, 1:DELETE, E:END) E

---

Group Definition

1. Group Name : AA
2. Pass Word : Canon
3. Comment : MOS
4. MEMBER
   (1) OC : Comment A
   (2) WA : Comment B
   (3) RC : Comment C
   (4) RA : Comment D Select NO. or End    E

AA ⎧ OC : Comment A
   ⎪ WA : Comment B
   ⎨ RC : Comment C
   ⎩ RA : Comment D

FIG. 11

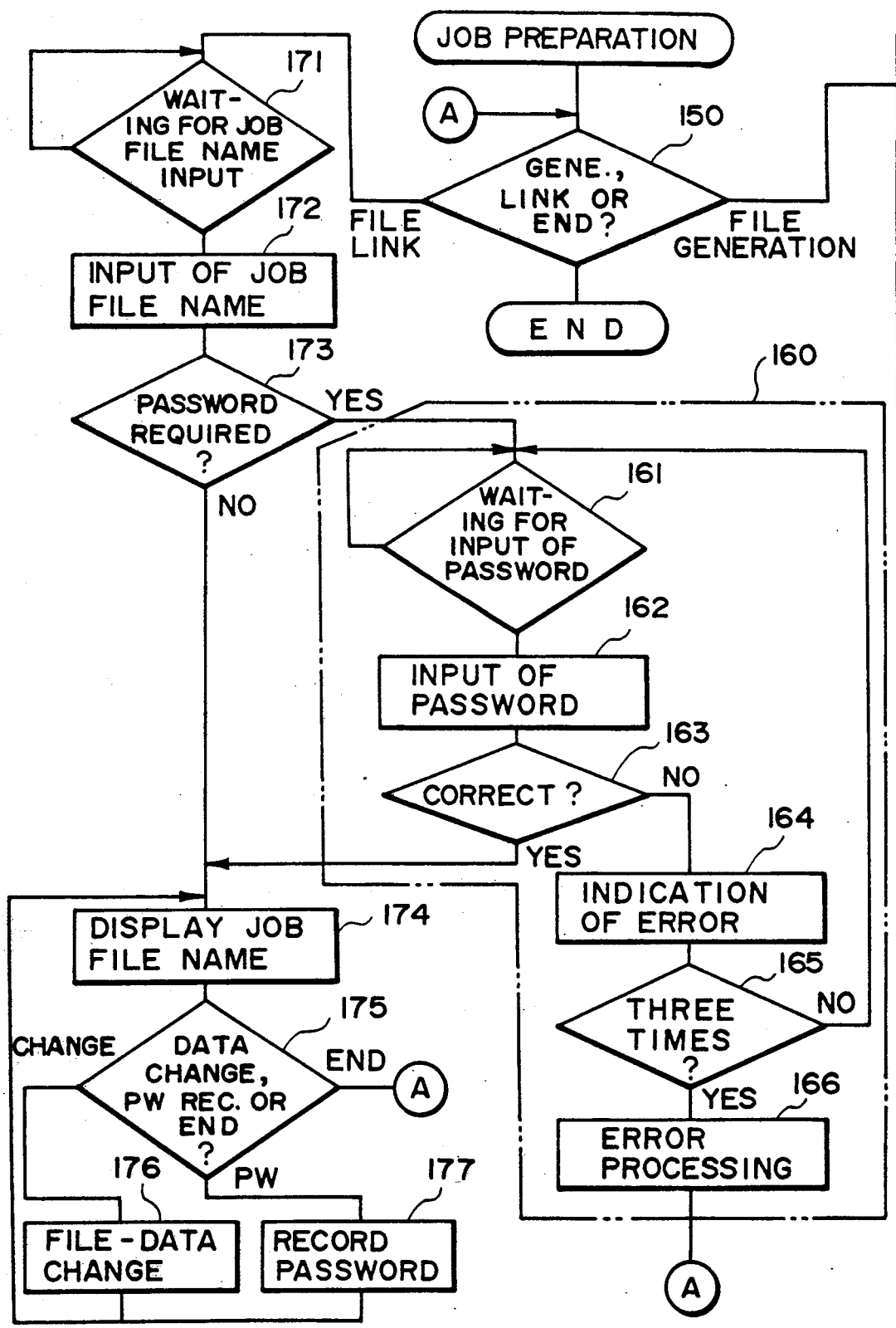
F I G. 12A

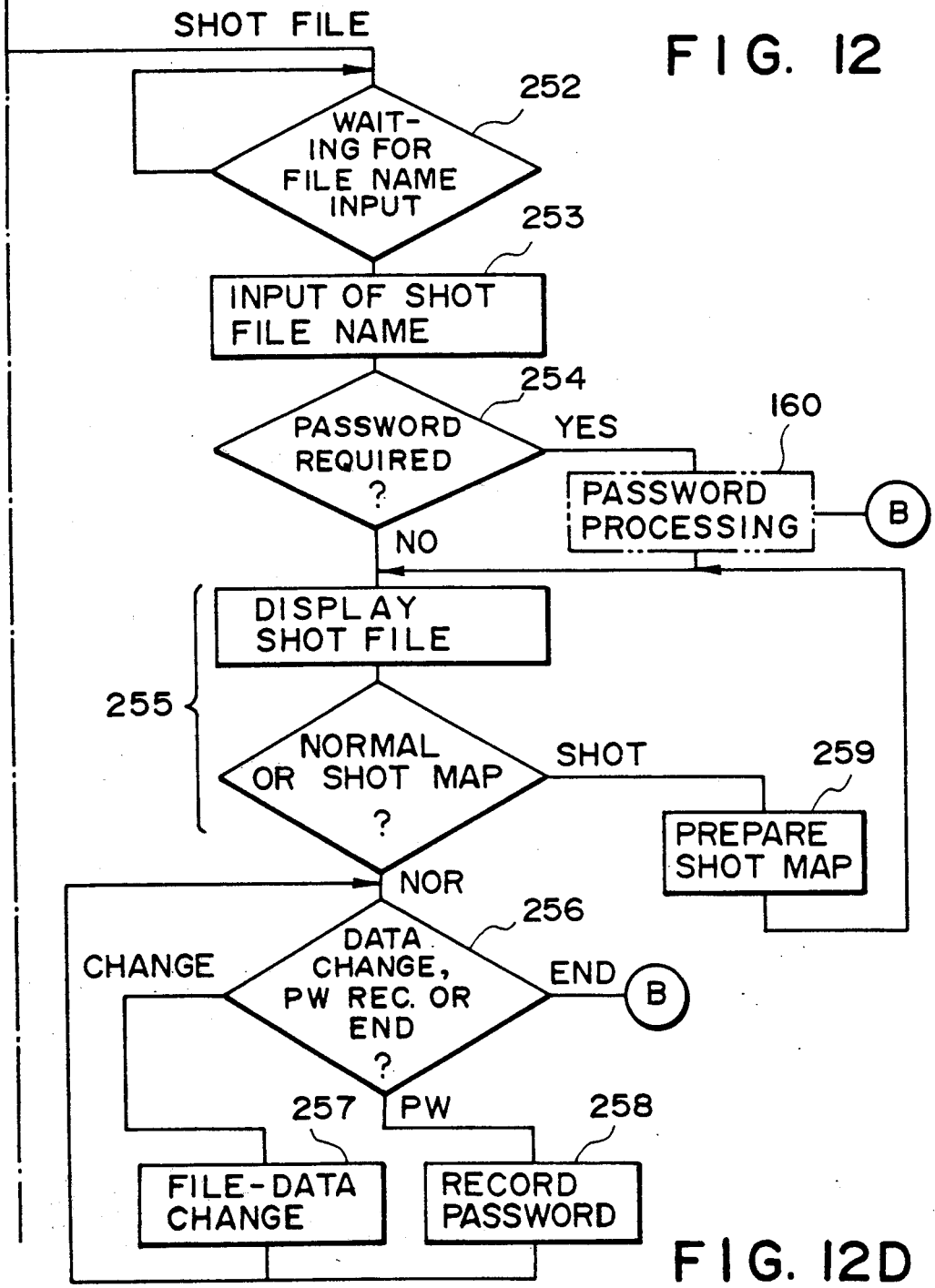

```
    JOB GENERATION

1.  LAYOUT FILE

2.  PROCESS FILE

3.  SHOT FILE

SELECT NO. OR END      [2]  —43
```

F I G. 13A

```
     PROCESS FILE

1. PROCESS NAME
2. COMMENT
3. MODE
4. RETICLE NO.
5. AA MARK POSITION
6. TV PA MARK POSITION
7. PASS WORD

SELECT NO. OR END      2
```

F I G. 13B

```
         PROCESS  FILE

1.  PROCESS  NAME
  2.  COMMENT
  3.  MODE
  4.  RETICLE  NO.
  5.  AA  MARK  POSITION
  6.  TV  PA  MARK  POSITION
  7.  PASS  WORD

1.  PROCESS  NAME   PROCESS 1⊃

SELECT NO. OR  END    3⊃
```

FIG. 13C

```
         PROCESS  FILE

1.  PROCESS  NAME
  2.  COMMENT
  3.  MODE
  4.  RETICLE  NO.
  5.  AA  MARK  POSITION
  6.  TV  PA  MARK  POSITION
  7.  PASS  WORD

3.  MODE (0: 1st MASK, 1: Die by Die, 0⊃
           2: TTL Global )
       SELECT NO.  OR  END           E⊃
```

FIG. 13D

```
FILE LINKER
1. LINK JOB NAME      : JOB 1
2. LAYOUT FILE NAME   : LAYOUT 2
3. PROCESS FILE NAME  : PROCESS 1
4. SHOT FILE NAME     : SHOT 3
5. PASS WORD          : MOS

SELECT NO. OR END   3
```

```
FILE LINKER
1. LINK JOB NAME      : JOB 1
2. LAYOUT FILE NAME   : LAYOUT 2
3. PROCESS FILE NAME  : PROCESS 1
4. SHOT FILE NAME     : SHOT 3
5. PASS WORD          : MOS

3. PROCESS FILE NAME  : PROCESS 3
```

```
           FILE LINKER
    1.  LINK JOB NAME       : JOB 1
    2.  LAYOUT FILE NAME    : LAYOUT 2
    3.  PROCESS FILE NAME   : PROCESS 3
    4.  SHOT FILE NAME      : SHOT 3
    5.  PASS WORD           : MOS

SELECT NO. OR END        E ↵
```

F I G. 14C

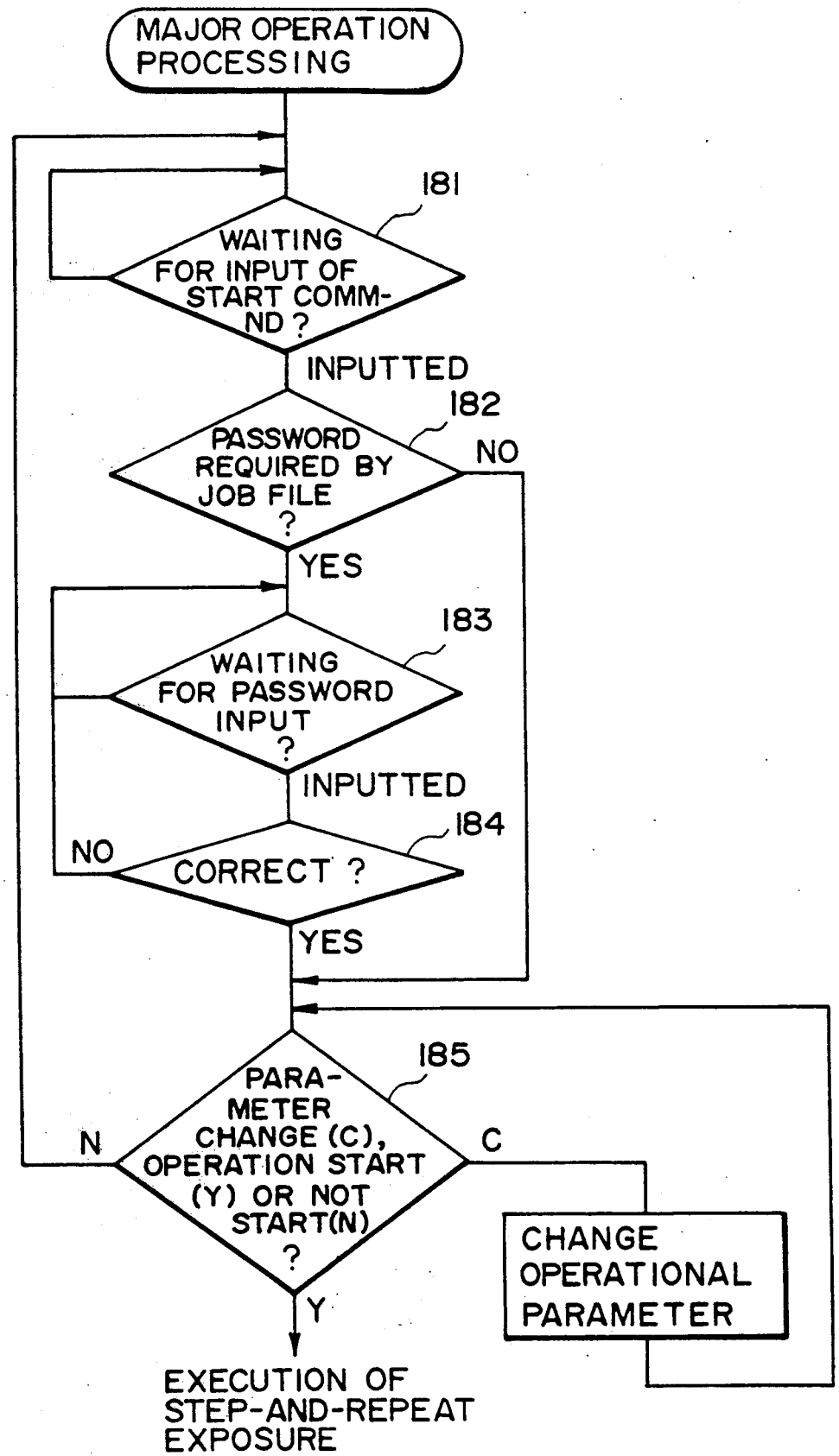
F I G. 15

```
        JOB   GENERATION

1.  LAYOUT  FILE

2.  PROCESS  FILE

3.  SHOT  FILE

SELECT NO. OR  END      [3]
```

F I G. 17A

```
        JOB   GENERATION

N :  NORMAL

M :  SHOT  MAP

SELECT M,N OR  END     [N]
```

F I G. 17B

```
SHOT   FILE
─────────────────
1. SHOT FILE NAME
2. COMMENT
3. EXPOSURE TIME
4. MASKING CONTROL
5. PASS WORD

SELECT NO. OR END      1⟩
```

FIG. 17C

```
SHOT   FILE
─────────────────
1. PROCESS   NAME
2. COMMENT
3. EXPOSURE TIME
4. MASKING CONTROL
5. PASS WORD

1. SHOT NAME       SHOT ⟩
   SELECT NO. OR END     3⟩
```

FIG. 17D

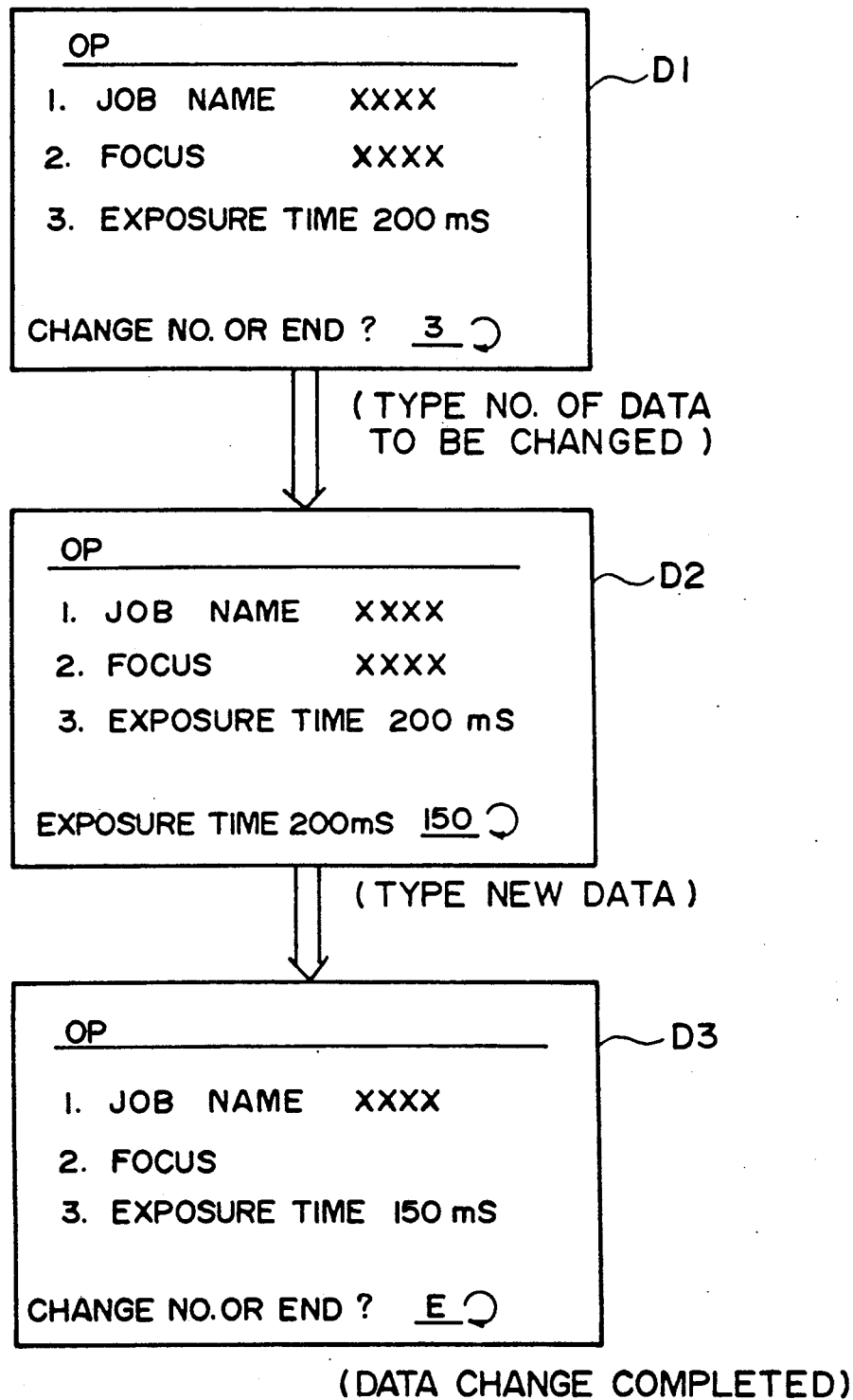
F I G. 21

CONTROL SYSTEM FOR A FINE PATTERN PRINTING APPARATUS

This application is a continuation of prior application, Ser. No. 07/637,941 filed Jan. 8, 1991, which application is a continuation of prior application, Ser. No. 06/888,490 filed Jul. 23, 1986, both now abandoned.

FIELD OF THE INVENTION AND RELATED ART

This invention generally relates to a fine pattern printing apparatus such as, for example, a projection exposure apparatus for use in the manufacture of large scaled integrated circuits, very large scaled integrated circuits, liquid crystal panel display devices, etc. More particularly, the invention is concerned with a control system for such a fine pattern printing apparatus, for allowing control of the operation of the apparatus.

Step-and-repeat type projection exposure apparatuses are well-known in the field of manufacture of semiconductor devices or microcircuits such as large scaled integrated circuits and the like. In such apparatuses, an exposure operation (pattern printing or photoprinting operation) which is the major function of the apparatus is performed in accordance with a predetermined sequence. Additionally, these apparatuses are usually arranged so that individual unit operations which are the components of the exposure operation, such as wafer loading, wafer unloading, step feeding of an X-Y stage, mask alignment, mask-to-wafer alignment, Z-axis movement of a Z stage, pattern transfer operation and so on, can be executed independently of each other.

However, other than the sequence for the above-described exposure operation, no set of unit operations are assembled in the apparatus as a sequence. For example, if it is desired to examine the accuracy of Z-axis movement of the Z stage, such examination cannot be executed in accordance with a sequence preset in the apparatus. That is, such an examination cannot be made automatically. Therefore, to execute such an accuracy examination, an operator has to be devoted to manipulation of the apparatus to handle a keyboard to instruct, in a sequential manner, Z-axis movement of the Z stage, measurement with air-microsensors, display of results of measurement, etc. This is very complicated and troublesome, and often leads to error.

On another point, improvements in the capacity of integrated circuits have enforced further improvements with respect to the function and performance of the semiconductor device manufacturing exposure apparatus. And, according to such tendency, a large number of commands and parameters necessary for operating the apparatus are prepared in the apparatus. Every one of the number of commands and parameters plays an important role with respect to control of the operation of the apparatus and, in addition thereto, is indispensable to make use, at best, of the functions which the apparatus is provided with.

Since, however, the number of these commands and parameters is extraordinarily large, it is not practically possible for operators or engineers, such as maintenance staffs, to be very familiar with all the commands and parameters. Particularly, in the field to which the present invention pertains, the operator is one who is posted to manage the apparatus with respect to only a few fundamental operations thereof such as, for example, start, stop, etc. Therefore, there will be no necessity that the operator be very familiar with all the commands and parameters.

Due to the extraordinary number of the commands and parameters, in any event, there are inconveniences in specifying a desired one of the commands and parameters. That is, for example, when such a command that is not often used is to be specified, the operator will have to refer to a manual to look it up. This is very cumbersome and frequently leads to mishandling. Moreover a command's name is usually provided by an abbreviation or is in the form of a code. Accordingly, reference to the manual to look up a wanted command, itself, is not so easy.

In a further point, when, in the semi-conductor device manufacturing exposure apparatus, a photomask is replaced by another or when wafers of a different lot are to be processed, the parameters being set in the apparatus at such time have to be checked. Since, however, the number of the parameters is extraordinarily large, as described, checking the parameters is very difficult for the operator who is posted to manage the apparatus with respect to only a few fundamental operations thereof such as, for example, start, stop, etc. In consideration of such inconveniences, a proposal has been made, according to which optimum parameters with respect to each unit operation, such as the working steps concerning one photomask, are preparatorily stored and, once the working steps to be executed are determined, corresponding parameters stored preparatorily are newly set in the exposure apparatus. Such a proposal still involves inconveniences. That is, the focus position and/or the exposure time change because of environmental conditions of the apparatus or aging of the apparatus. Accordingly, the parameters related to such factors should be corrected often.

In order to change a desired portion of the parameters set in the apparatus, it is necessary to refer to a list in a manual to find them out of all the parameters of an extraordinarily large number, and to specify the wanted parameters in the apparatus by typing code names of these parameters on the keyboard, and finally, to type revised data on the keyboard so as to change the selected parameters. This is very complicated and troublesome, and often leads to mishandling.

SUMMARY OF THE INVENTION

It is accordingly a primary object of the present invention to provide a control system for a fine pattern printing apparatus, by which system very easy manipulation of the apparatus is allowed.

It is another object of the present invention to provide a control system for a fine pattern printing apparatus, by which system the possibility of mishandling of the apparatus is significantly decreased.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 4–4D show an example of sequential display on a cathode ray tube, in accordance with the first feature of the control system of the FIG. 2 embodiment.

FIG. 7 is a schematic illustration showing an example of hierarchic classification of executable commands, in accordance with a second feature of the control system of the FIG. 2 embodiment.

FIGS. 9A–9E show an example of sequential display on the cathode ray tube, in accordance with the second feature of the control system of the FIG. 2 embodiment.

FIG. 11 shows an example of display on the cathode ray tube for the command input processing shown in FIG. 10.

FIGS. 12 and 12A–12D are a flow chart showing the manner of job preparation in the control system of the FIG. 2 embodiment, in accordance with third, fourth and fifth features of the present invention.

FIGS. 13A–13D and 14A–14C show an example of sequential display on the cathode ray tube, in accordance with the third feature of the present invention.

FIG. 15 is a flow chart showing an example of operation processing, prepared in accordance with the third feature of the present invention.

FIGS. 17A–17E show an example of sequential display on the cathode ray tube, corresponding to shot file processing shown in FIG. 12, in accordance with the fifth feature of the present invention.

FIG. 21 is a schematic illustration showing an example of sequential display on the cathode ray tube, corresponding to the parameter check-change operation shown in FIG. 20.

DESCRIPTION OF THE PREFERRED EMBODIMENTS

Figure 1:
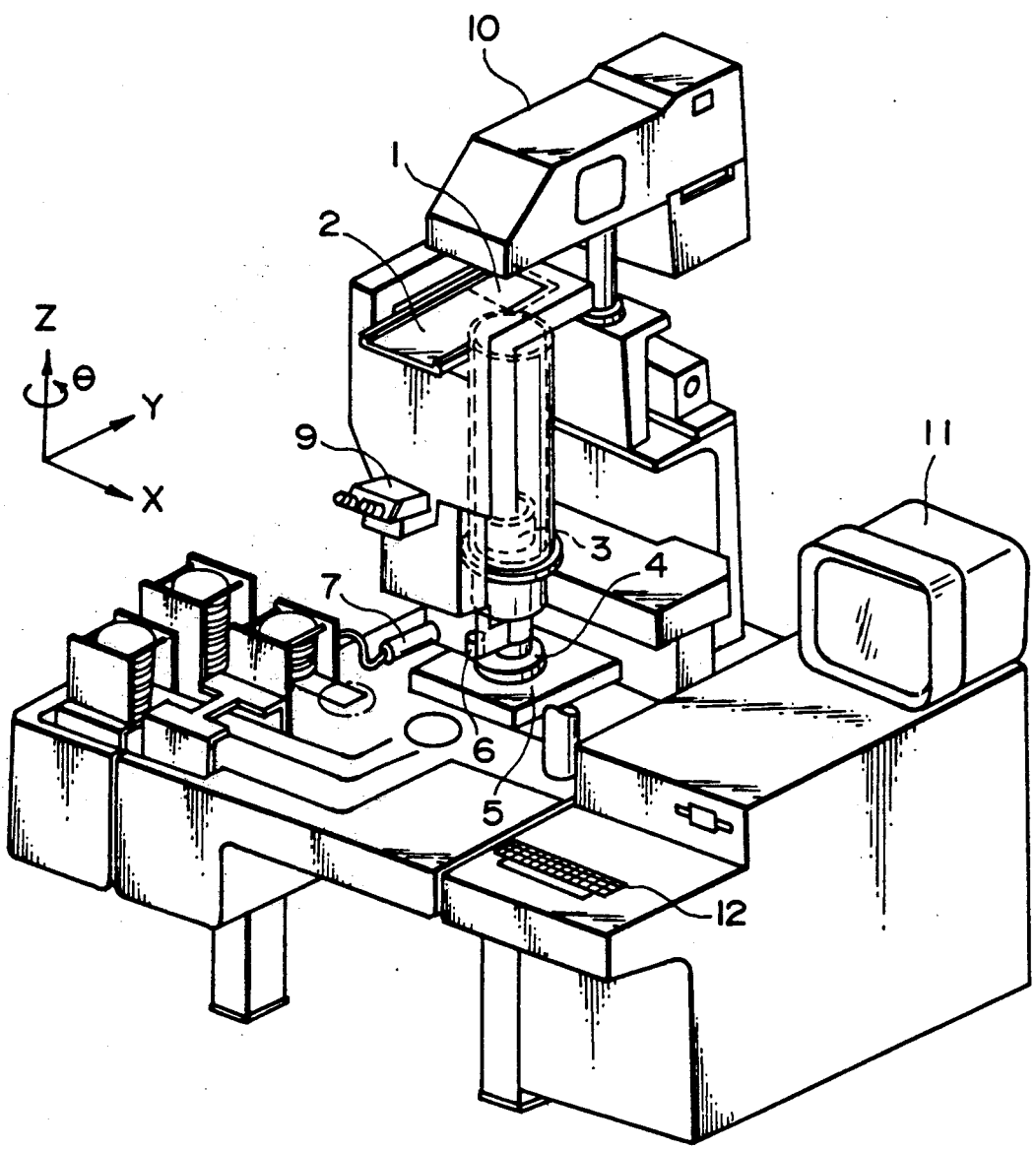
FIG. 1 is a perspective view schematically showing a semiconductor device manufacturing projection exposure apparatus into which a control system according to an embodiment of the present invention is incorporated.

Referring first to FIG. 1, there is shown a semiconductor device manufacturing projection exposure apparatus, into which a control system according to an embodiment of the present invention is incorporated. In FIG. 1, denoted by numeral 1 is a photomask or reticle (hereinafter simply "mask") having an integrated circuit pattern (not shown) formed thereon. In addition to this circuit pattern, the mask is provided with a mask alignment mark and mask-to-wafer alignment marks (not shown). The apparatus includes a mask stage 2 for holding the mask 1 movably in a plane (X-Y plane) and in a rotational direction ($\theta$ direction). Denoted by numeral 3 is a reduction projection lens; by 4, a wafer having a radiation-sensitive layer such as, for example, a photoresist layer. The wafer is provided with mask-to-wafer alignment marks and a TV wafer alignment mark. A wafer stage 5 holds the wafer 4 movably in a plane (X-Y plane) and in a rotational direction ($\theta$ direction). Also, the wafer stage 5 is movable between a TV wafer alignment station and a wafer exposure station (pattern transfer station) defined in the exposure apparatus, while carrying thereon the wafer 4. The apparatus further includes a TV wafer alignment detecting system having an objective lens 6 and an image-pickup tube 7 (or a solid image-pickup device). A binocular unit 9 is provided which is effective to observe the surface of the wafer 4 by way of the projection lens 3. A top unit 10 is adapted to accommodate therein a detecting system for detecting the mask-to-wafer alignment. Denoted by numeral 11 is a monitoring TV receiver (hereinafter "console CRT"). Keyboard 12 is operative to supply, into the apparatus, various inputs such as operation commands and parameters.

Figure 2:
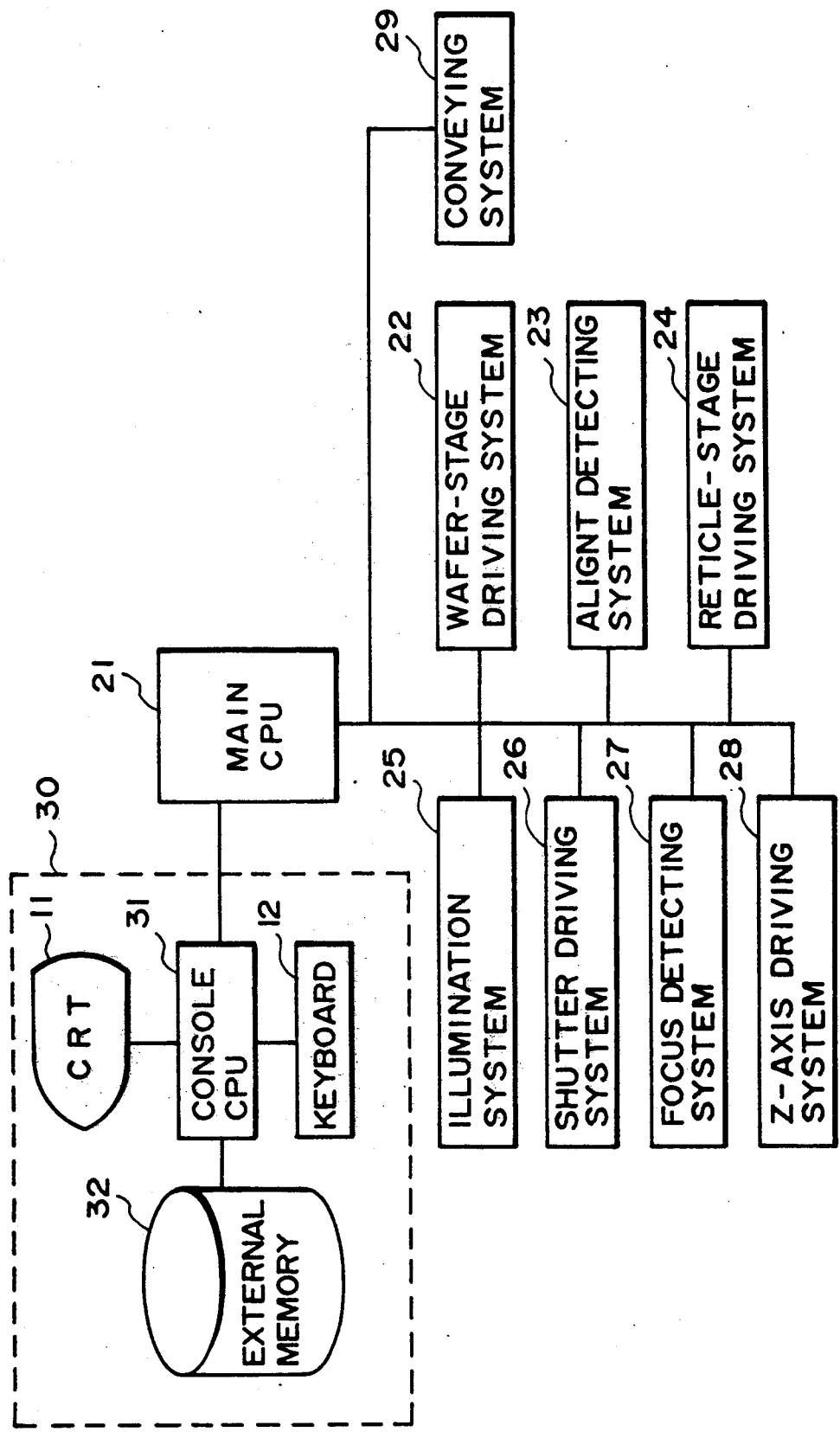
FIG. 2 is a block diagram showing major components of the projection exposure apparatus of FIG. 1 and the control system incorporated thereinto.

FIG. 2 is a block diagram schematically showing major components of the exposure apparatus and the control system according to this embodiment of the present invention and being incorporated into the exposure apparatus.

As shown in FIG. 2, the exposure apparatus includes a wafer stage driving system 22, an alignment detecting system 23, a mask or reticle stage driving system 24, an illumination system 25, a shutter driving system 26, a focus detecting system 27, and a Z-axis driving system 28. As for details of these components of the exposure apparatus, reference may be made to U.S. Pat. application Ser. No. 788,494 filed Oct. 17, 1985 and having the same assignee as of the subject application. The apparatus is provided with a main central-processing-unit 21 (hereinafter "main CPU") which is adapted to control the operations of the components 22–28 as well as to control the overall operation of the exposure apparatus. The apparatus is further provided with a wafer conveying system 29 for loading/unloading the wafer onto/- from the wafer stage.

Denoted generally by numeral 30 is a console unit which is provided to supply, to the main CPU 21, various commands and parameters concerning various operations to be executed in the exposure apparatus. The console unit 30 includes a console central-processing-unit (hereinafter "console CPU") 31 and an external memory 32 for storing therein the commands, parameters, etc. The CRT 11 and the keyboard 12, included in the console unit 30 are those shown in FIG. 1.

Figure 3:
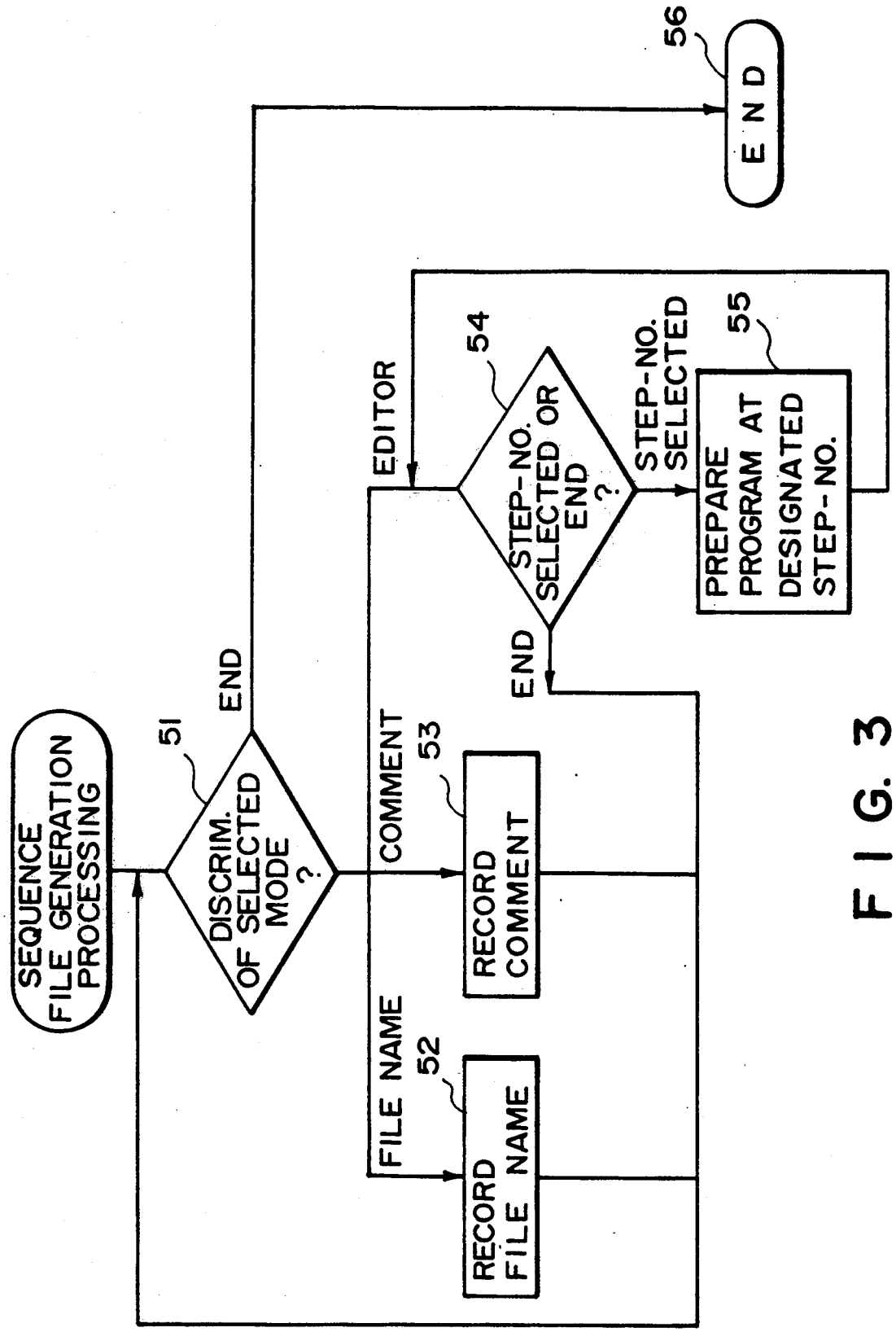
FIG. 3 is a flow chart showing sequence file generation processing according to a first feature of the control system of the FIG. 2 embodiment of the present invention.
Figure 5:
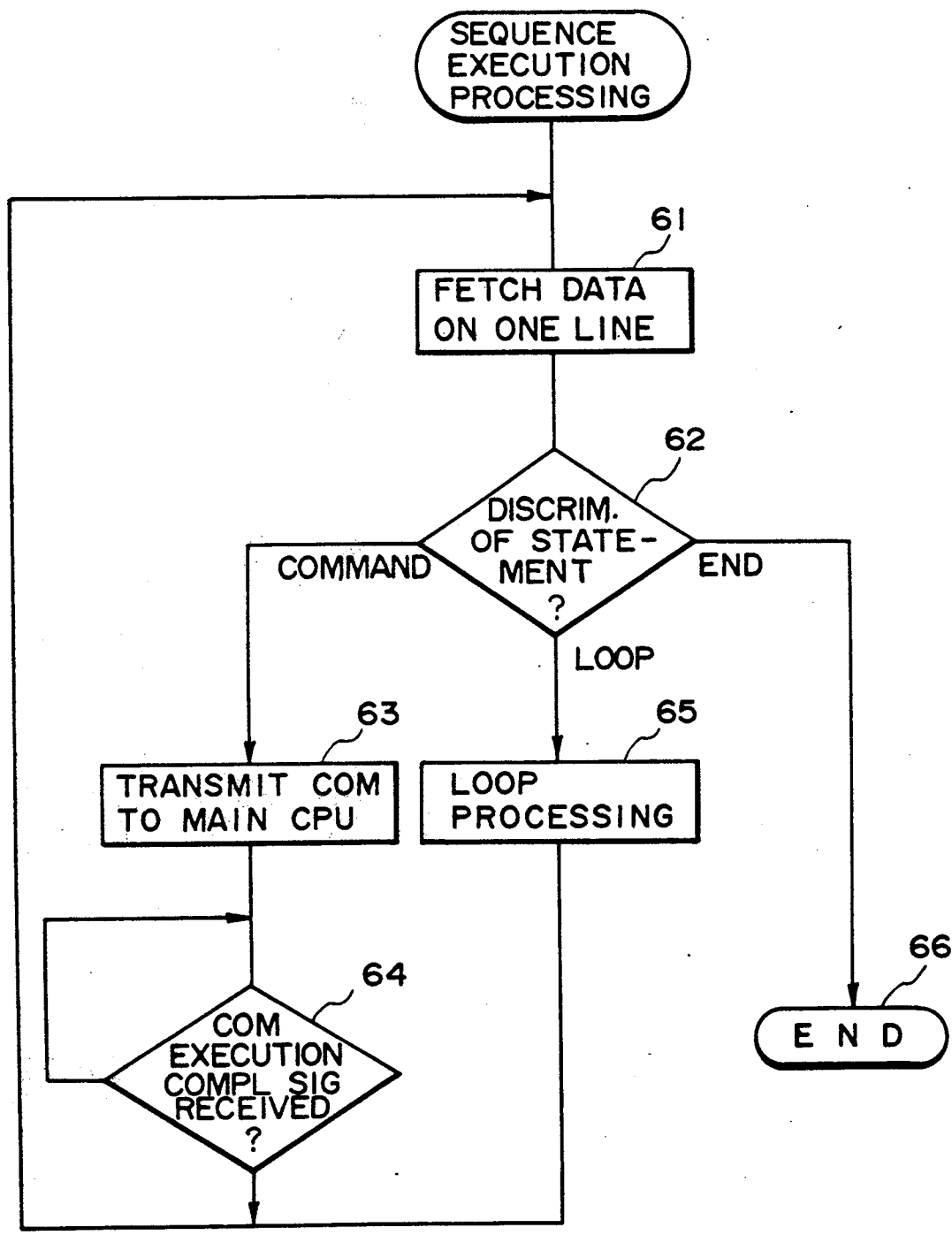
FIG. 5 is a flow chart showing sequence execution processing, in accordance with the first feature of the control system of the FIG. 2 embodiment.

Referring now to FIGS. 3-5, a first feature of the control system of the FIG. 2 embodiment will be described in detail.

FIG. 3 is a flow chart showing a processing for generating a user programmable sequence (hereinafter "sequence generation processing"), in accordance with the first feature of the present invention. In the apparatus shown in FIGS. 1 and 2, after the apparatus is started, a predetermined initialization processing is executed. And, upon completion of such initialization processing, the apparatus is placed in a command input waiting state. More specifically, the console CPU 31 is held in a stand-by state waiting for input from the keyboard 12, while the main CPU 21 is held in a stand-by state waiting for signal input from the console CPU 31. The apparatus is placed in such a command input waiting state also when the apparatus is reset.

When, in such a stand-by state as described, a sequence generation instructing command (e.g. a code "AS") is inputted from the keyboard 12, the sequence generation processing as described below is initiated under the control of the console CPU 31.

At Step 51 shown in FIG. 3, a picture such as shown in FIG. 4A is displayed on the CRT 11 (although data in a phantom-line area 43 is not displayed). Then, numerals and/or letters sequentially typed on the keyboard 12 are displayed in the bottom portion of the picture plane of the CRT 11, i.e. in the phantom-line area 43 shown in FIG. 4A. Finally, on the basis of data inputted before a line-feed key of the keyboard 12 is pressed, discrimination is made as to the selected mode, i.e. as to which one of a file name mode (1), a comment mode (2), an editor mode (3) and an end mode (E) displayed on the CRT 11 is selected. That is, the operator selects one of these modes by typing on the keyboard one of numerals "1", "2" and "3" and a letter "E". It is to be noted that, at a time just after the sequence generation processing is initiated, no data is displayed in phantom-line areas 41 and 42 depicted in FIG. 4A, and that a line-feed mark depicted by an arrow shown in the phantom-line area 43 is illustrated in the drawings only for the sake of convenience, and actually, it is not displayed.

When at Step 51, the file name registration mode (1) is selected, the sequence goes to Step 52. And, data concerning the file name is inputted by the operator from the keyboard, the input data being displayed in the phantom-line area 41 of the picture plane of the CRT 11, such as shown in FIG. 4A. Upon completion of input of the file name data, the line feed key is pressed and, in response thereto, the inputted file name data ("Z MEASURE" in this example) is stored into a file name area of the external memory 32 as the file name of the operational sequence which is going to be generated. Subsequently, the file generation processing sequence goes back to Step 51. It is to be noted that the thus stored file name will be treated essentially the same as a "command name" set by the maker of the apparatus, when the apparatus is operated. In other words, when the thus registered file name is specified by the keyboard in the command input waiting state described hereinbefore, the apparatus is automatically operated so as to execute the operational sequence set in the external memory in this file name. This will be described later in more detail.

When, at Step 51, the comment registration mode (2) is selected, the sequence goes to Step 53. That is, after selection of the comment mode, the operator inputs, from the keyboard, data concerning the comment on the sequence file which is going to be generated. And, at Step 53, the inputted data concerning the comment is displayed in the phantom-line area 42 in the picture plane of the CRT 11. After completion of the data input, the operator presses the line-feed key. In response thereto, the inputted data concerning the comment is stored into a comment area of the external memory 32 as a comment or narrative for the operational sequence which is going to be generated. Thereafter, the file generation processing sequence returns to Step 51. It is to be noted that the thus registered comment has no affect upon operation of the apparatus when the corresponding file name is used as a command.

When at Step 51 the editor mode (3) is selected, the sequence goes to Step 54. The editor mode is one for preparing the content of a new operational sequence or for changing the content of an operational sequence having been prepared or being prepared. At Step 54, display on the CRT 11 is changed to one shown in FIG. 4B, although data in a phantom-line area 4 is not displayed. In the picture of FIG. 4B, characters "S1", "S2", ..., "Sm" each represent the Step-No. of a command to be designated. And, the operator types on the keyboard 12 one of the Step-Nos. "S1", "S2", ..., "Sm" and a letter "E" instructing to end the sequence. The selected data is displayed in the phantom-line area 44 (FIG. 4B). Then, the operator presses the line-feed key and, in response thereto, discrimination is made at Step 54 as to whether any "Step-No." or "END" is selected. If any "Step-No." has been inputted, the sequence proceeds to Step 55 at which a program is prepared with respect to the designated Step-No. More specifically, in this embodiment, a plurality of unit-operation instructing commands, each instructing execution of corresponding ones of plural unit operations which are the components of the overall operation of the exposure apparatus, are stored in the external memory independently of each other. And, with respect to the selected Step-No. such as "S1"for example, the operator designates, using the keyboard, a desired one of the unit-operation instructing commands. Actually in this embodiment, a corresponding command name is inputted. In place of designation of any command, a particular statement may be inputted, as will be described later. At Step 55, the command designated by way of the keyboard 12 is displayed on the CRT 11 and in an area corresponding to the selected Step-No., such as shown in FIG. 4C, as a command of the Step-No. selected by way of the keyboard 12. Simultaneously therewith, the designated command is stored into the external memory 32. Thereafter, the sequence goes back to Step 54. By repeating Steps 54 and 55, a series of operations such as depicted in FIG. 4C are set as an automatic operational sequence. In the picture of FIG. 4C characters "LOOP" denote a loop processing, "10" depicts the number of repetitions, "S2" and "S3" depict the Step-Nos. to be repeated. Also, characters "ZD" depict the Z-axis driving, while "FC" depicts detection of the position of the wafer 4 in the Z-axis direction.

If such a Step-No. in which any command has been registered is designated by way of the keyboard, it is then possible to change the content of the operational sequence.

The above-described editor mode is ended in response to input of "END" from the keyboard 12, typing the letter "E", and the sequence goes back to Step 51. The display on the CRT 11 at Step 51, at this time, is the same as shown in FIG. 4A.

When at Step 51 a code "E" is inputted from the keyboard 12, such as shown in FIG. 4D, the mode "END" is selected. In such a case, the sequence goes to Step 56 and the sequence file generation processing is finished.

The operation necessary for the sequence file generation processing can be summarized as follows:

(1) First, in the command input waiting state, the sequence generation instructing command (e.g., "AS") is inputted by way of the keyboard 12.

(2) In accordance with the display on the CRT 11 (FIG. 4A), the editor mode is selected, using the keyboard 12. In this example, a numeral "3" is typed on the keyboard.

(3) While viewing the display on the CRT 11 (FIG. 4B), the operator handles the keyboard 12 so as to designate a desired Step-No. and to input a desired command corresponding to the selected Step-No. This is repeated as desired.

(4) Viewing the display on the CRT 11 (FIG. 4C), the operator checks whether the desired operational sequence has been prepared as a result of the inputs from the keyboard. If completed, the operator inputs the code "E" from the keyboard 12, whereby the editor mode is finished.

(5) At this time, the display on the CRT 11 is such as shown in FIG. 4A. In this state, the operator selects the file name registration mode by typing numeral "1", in this example, on the keyboard 12. Then, the operator types a desired file name on the keyboard 12, whereby such a file name is stored in the external memory.

(6) At this time, the display on the CRT 11 is also such as shown in FIG. 4A. In this state, the operator selects the comment registration mode by typing the numeral "2", in this example, on the keyboard 12, and then the operator types a desired comment for this file on the keyboard, whereby the comment is stored.

(7) Finally, in the display state shown in FIG. 4A, the operator selects the mode "END" by typing the letter "E", in this example, whereby the sequence file generation processing is finished.

In the sequence file generating process described above, the order of steps (1)-(4); the step (5); and the step (6) may be changed. Also, the step (6) may be omitted as desired.

FIG. 5 shows the processing necessary for executing the operational sequence prepared in the manner described hereinbefore.

When, in the command input waiting state as described, a file name ("Z MEASURE" in this example) is designated by way of the keyboard, the console CPU 31 is operated to effect research for the file name stored in the external memory 32 and, when it is found, to read out the data written in the corresponding file. In response thereto, the automatic operational sequence execution processing in the exposure apparatus is initiated.

In such processing, the console CPU 31 is operative to sequentially read out the data stored in the external memory 32. More particularly, each time it reads out such a portion of the data corresponding to one line (Step 61). Then, discrimination of the statement (the read data) is made by the console CPU 31 (Step 62). In accordance with the result of the discrimination, the following operations are performed.

If the fetched accessed data is a command, such command is transmitted to the main CPU 21 (Step 63), such that the control system is held in a stand-by state until a command execution completion signal or code is supplied from the main CPU 21 (Step 64). On the other hand, the main CPU 21 controls corresponding portions of the exposure apparatus in accordance with the command supplied thereto from the console CPU 31. And, in accordance with the state of execution of the instructed command, the main CPU 21 supplies the command execution completion code to the console CPU 31. This is made in order to assure synchronization between the main CPU 21 and the console CPU 31. In response to reception of the command execution completion code supplied from the main CPU 21, the console CPU 31 being in a stand-by state at Step 64 starts accessing such a portion of the data that corresponds to the next line (Step 61).

If, on the other hand, the data accessed at the first time at Step 61 is the statement "LOOP" representing or instructing repetition of any command, the sequence goes to Step 65 whereat the loop processing is effected. The loop processing is a process in which the Step-No. or Step-Nos. (e.g. "S2", "S3") corresponding to one or more commands to be executed repeatedly, and the number of repetitions to be made are stored. Also, in such a process, a counter which may function as a line pointer (Step-No. pointer), is operative upon reading the one-line data out of the memory.

As an example, description will be made to execution of the operational sequence such as depicted in FIG. 4C. The data at the Step-No. "S1" is the statement "LOOP". Accordingly, the Step-Nos., "S2" and "S3" in this example, with respect to which the commands to be executed repeatedly are registered, as well as the number of repetitions, "10" in this example, are stored in a random access memory area in the console CPU 31. Then, at the time of a reading operation, from the Step-No. "S2" to the Step-No. "S3" (i.e. execution of Steps 63 and 64), the number by which the operation of the Step-No. "S3" has been executed is counted. If the counted number is less than "10", the above-described counter is decremented back to the Step-No. "S2" from the Step-No. "S3". In this manner, until the "ten times" execution is completed, the counter is not incremented to the next Step-No. "S4" from the Step-No. "S3".

If the data accessed at the Step 61 is the statement "END", the sequence goes to Step 66 because such a statement denotes the ending of the operational sequence. Whereby, the sequence execution processing is finished.

Figure 6:
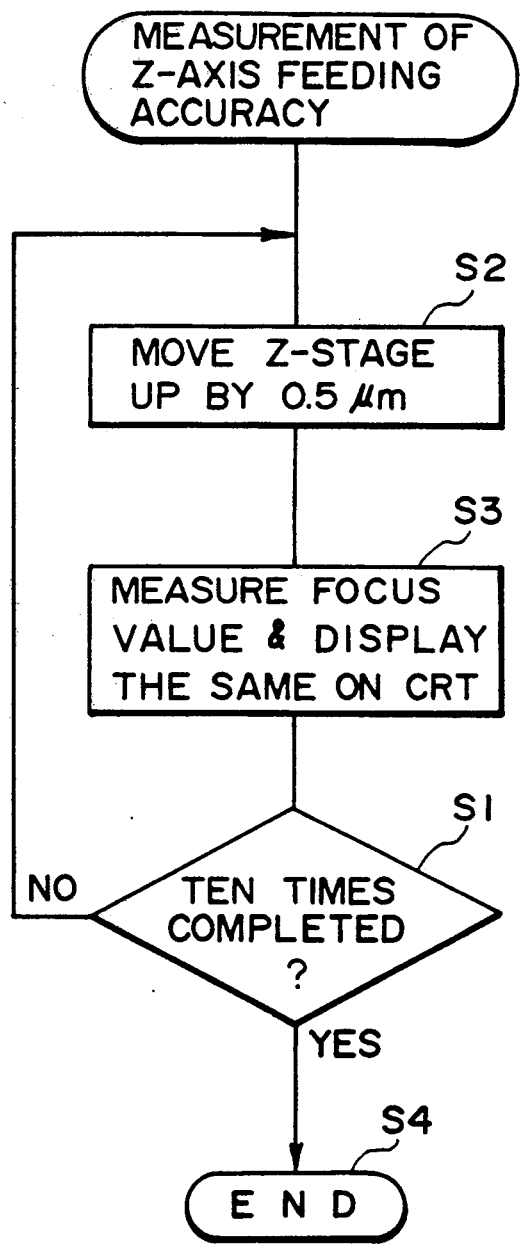
FIG. 6 is a flow chart showing the manner of automatic measurement of Z-axis feeding accuracy, which is an example of an automatic sequence generated in accordance with the first feature of the control system of the FIG. 2 embodiment.

It will be seen from the foregoing that, in the exposure apparatus of the present embodiment, input of the file name "Z MEASURE" from the keyboard 12 as a command, in the aforementioned command input waiting state, causes execution of the operational sequence such as depicted in FIG. 4C. In other words, as illustrated in FIG. 6, the Z stage is moved up by 0.5 micron (Step-No. "S2"), the focus value (the Z-axis position of the wafer 4) is measured by the focus detecting system 27, and the result of the measurement is displayed on the CRT 11 (Step-No. "S3"). And, these operations are repeated (Step-No. "S1"), and the operation is finished (Step-No. "S4"). As understood, the repetition of Z-axis movement of the stage and measurement of the Z-axis position is made in order to detect or measure the accuracy in the Z-axis feeding of the Z stage. And, in accordance with this embodiment of the present invention, such a measurement can be executed automatically, once a corresponding operational sequence is set.

In order to effect such a measurement of the Z-axis feeding accuracy, without the present invention, the operator has to concentrate on the manipulation of the apparatus to handle the keyboard, exactly in accordance with the predetermined sequence, so as to input the command "ZD" when the apparatus is in the command input waiting state, the command "FC" after completion of the Z-axis movement and after confirmation of that the apparatus is returned to its command input waiting state. And, these command inputting operations, which should be made manually, have to be repeated by the predetermined times.

In accordance with the first aspect of this embodiment of the present invention, as has been described hereinbefore, desired operational sequences can be set or registered in the apparatus, and this can be done by the of user of the apparatus. As a result, such a process that has conventionally required a series of very complicated and troublesome operations (e.g. accuracy measurement, correction for the amount of unit movement,, etc. can be executed simply by inputting the one and corresponding command. Therefore, very easy manipulation of the apparatus is ensured.

While in the foregoing description, the measurement of the Z-axis feeding accuracy is explained, this is merely an example. According to the first feature of the present embodiment, such an operational sequence that comprises repetition of the same command only, can be prepared. This is very effective to automatically repeat the position detection, the focus detection, etc., for the sake of measurement of the position detecting accuracy, the focus detecting accuracy and so on.

Referring now to FIGS. 7-11, a second feature of this embodiment of the present invention will be described.

FIG. 7 is an illustration schematically showing hierarchic classification of the executable commands (unit-operation instructing commands), in accordance with the second feature of the present embodiment. In summary, according to this feature, the executable commands are classified into some groups with respect to a predetermiend reference or references such as, for example, function, type or operating component, etc.

In FIG. 7, the blocks illustrated in the bottom class denote the executable commands. That is, when the command name of one of these executable commands is inputted, in the command input waiting state, the apparatus is operated to execute such a processing that corresponds to the designated command. In FIG. 7, characters "OC" denote offset check (position detection), "WA" denote wafer alignment, "RC" denote reticle check (mask position detection), "RA" denote reticle alignment (mask alignment), "EX" denote exposure, "SO" denote shutter open, "SC" denote shutter close. The illustrated executable commands are examples, and many other executable commands are prepared in the apparatus. As shown in FIG. 7, these executable commands are classified into groups, each having a group name such as depicted in a middle class shown in FIG. 7. That is, characters "AA" denote automatic alignment, while characters "EXPO" denote exposure. It is a possible alternative that one executable command is included as a member of each of different groups.

Figure 8:
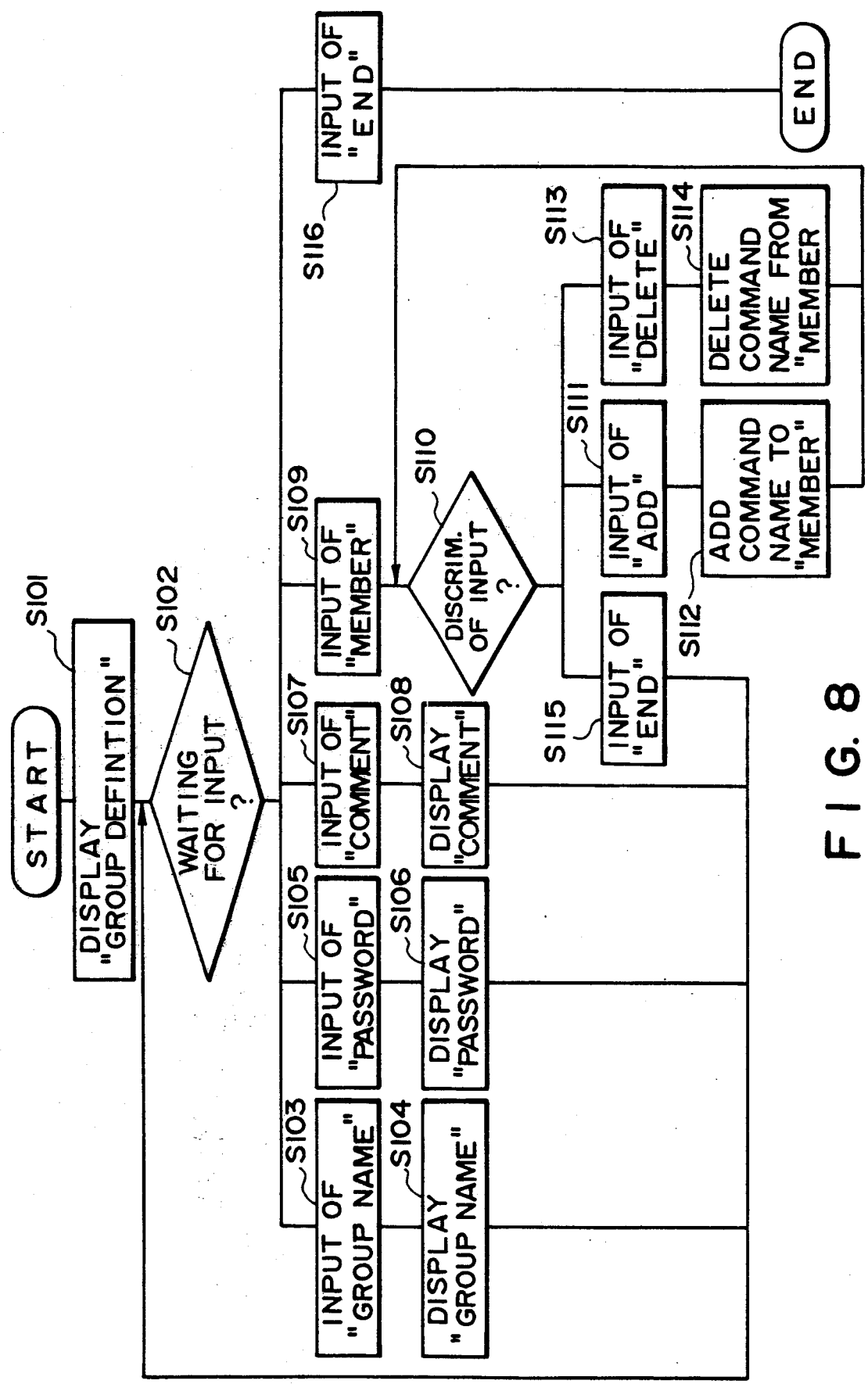
FIG. 8 is a flow chart showing the manner of operation for hierarchic classification of the executable commands.

Referring to FIGS. 8-9D, the process for defining a group or groups of executable commands in the apparatus shown in FIGS. 1 and 2 will be described.

In the apparatus of the present embodiment, as described, the command input waiting state is established upon completion of the initialization processing after the start of the apparatus. Also, when execution of a particular operation instructing command is completed, the command input waiting state is also established. That is, the console CPU 31 is held in its stand-by state, waiting for input from the keyboard 12, while the main CPU 21 is held in its stand-by state waiting for input of a signal from the console CPU 31. When, in this state, a command instructing execution of command group definition ("GD" in this example) is inputted from the keyboard 12, the following group definition processing is initiated under the control of the console CPU 31.

In this example, description will be made to a case where an executable command is to be registered as an additional member of a group which has already been defined. Whether a command group is to be newly defined or an already established definition of a particular group is to be changed, is determined at the time of inputting the group definition command. For example, the system may be arranged so that, when a code "GD AA" which corresponds to the command name "GD" with a parameter of the group name "AA", is designated, a sequence for changing the definition of the group "AA" is selected, while when a code without a parameter is inputted, a sequence for newly defining a group is selected.

In the group definition processing, the CRT 11 displays the name of the group to be processed, a password, and the like (Step S101), such as illustrated in FIG. 9A. The data as illustrated is one that has been stored in the external memory 32. In the case of FIG. 9A, the group name is "AA", the password is "Canon", the comment is "MOS", the members are "OC", "WA" and "RC". Each of the members is provided with a corresponding comment. Characters "Select No. or End" at the bottom portion of the display on the CRT 11 is a prompt message which is given to the operator to urge designation of the item to be changed or an input of a code "E" instructing ending the group definition processing "Step S102". By typing of the numbers assigned to respective items, on the keyboard, the item with respect to which the data change is to be made can be selected. For example, when No. "1" is designated, a change of group name is attainable at Steps S103 and S104. As for the password and comment, they can be changed in a similar manner at Steps S105-S108. In the picture of FIG. 9A, No. "4" is designated in order to effect processing relative to the members (Step S109). In response to designation of No. "4", the display on the CRT 11 is changed to one as shown in FIG. 9B. In this state of display, the definition information on the group is the same as that shown in FIG. 9A. However, the FIG. 9B display contains a different prompt message at its bottom portion. That is, the message "Select (0: ADD, 1: DELETE, E: END)" is given to the operator to urge an input as to whether a member is to be added or deleted or the member changing process is to be ended (Step S110). After a particular input is supplied at Step S110, discrimination is made as to which one of an adding mode, a deleting mode and an ending mode is selected. If the adding mode is selected, the member adding operation is executed at Steps S111 and S112. If the deleting mode is selected, a corresponding operation is executed at Steps S113 and S114. In the FIG. 9B case, a code "0" is designated which represents the addition of a member (Step S111). In response to designation of the member adding mode, the CRT 11 displays a picture such as depicted in FIG. 9C. In the bottom portion, a message "ADD (4)" is displayed, which means that processing for the addition of the fourth member is being executed. If, as shown in FIG. 9C, data "RA: Comment D" is inputted as the information on the new member, the picture on the CRT 11 is changed to one such as shown in FIG. 9D, and the new member is registered (Step S112). Then, the sequence goes back to Step S110, such that a further member changing process can be continued. When the member changing process is to be ended, the code "E" is inputted at Step S110, i.e. in the display of FIG. 9D (Step S115). As a result, the sequence goes back to Step S102. When the group definition processing is to be ended, on the other hand, the code "E" is inputted at Step S102, i.e. in the display of FIG. 9E (Step S116). By doing so, all the definition data concerning the thus treated group is stored into the external memory 32.

Figure 10:
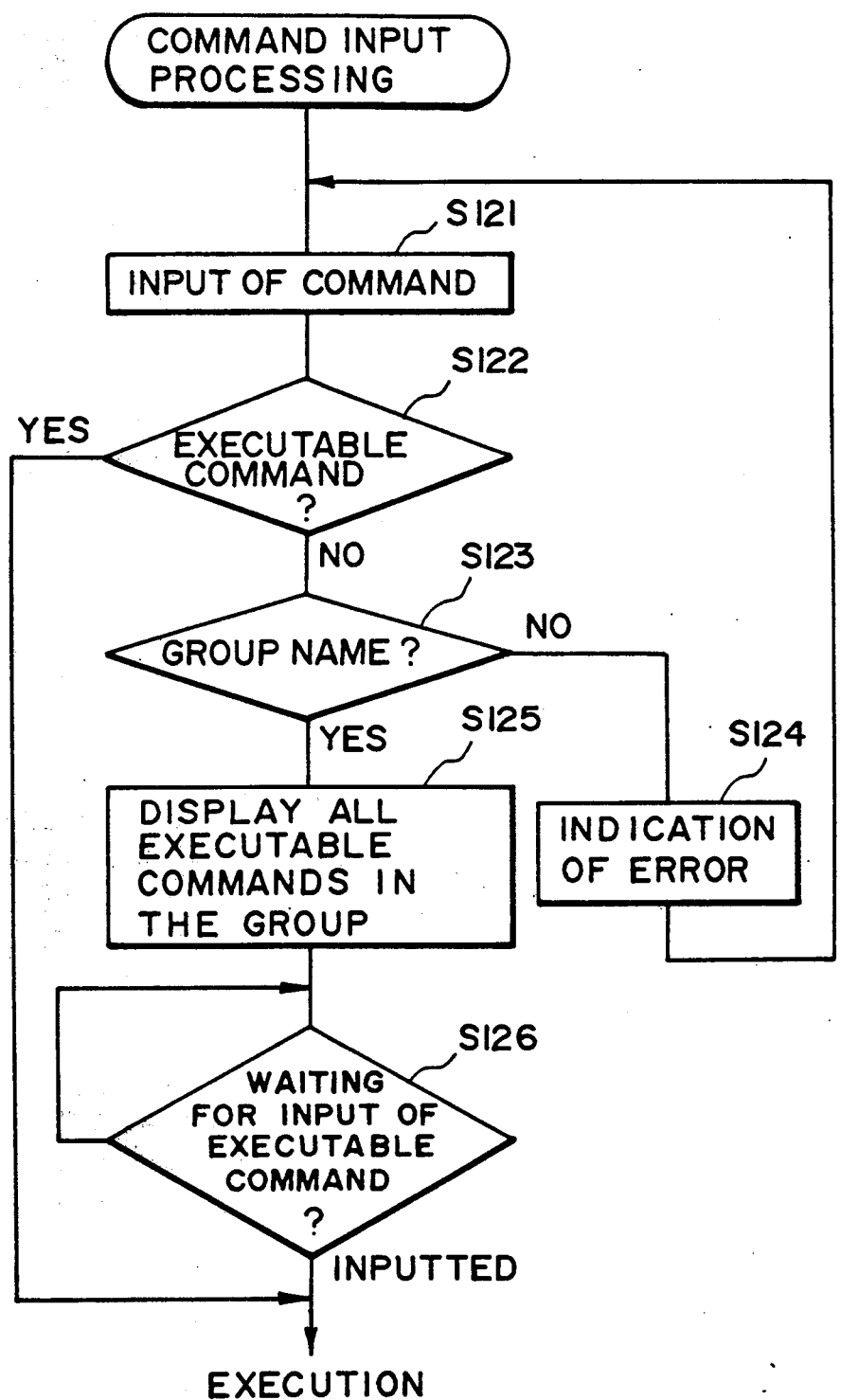
FIG. 10 is a flow chart showing command input processing, in accordance with the second feature of the control system.

Referring to FIGS. 10 and 11, the command input operation in the apparatus of FIGS. 1 and 2 will be described.

When, in the command input waiting state, a particular command is designated by way of the keyboard 12 (Step S121), discrimination is made at Step S122 as to whether or not the designated command is one of an executable level, i.e. whether an executable command. If it is an executable command, the operation corresponding to the designated executable command is executed. If not so, additional discrimination is made at Step S123 as to whether or not the designated one is a group name. If not any group name, the error is indicated at Step S124, and the sequence goes back to Step S121 whereby the system is held again in the command input waiting state. If the designated one is a group name (Step S123), the data about the corresponding group such as, for example, all the executable commands which are the members of the group, is read out of the external memory 32 and is displayed on the CRT 11 in the form of a list (Step S125). This is illustrated in FIG. 11. As shown in this Figure, a command input area is prepared in the upper portion of the picture of the CRT 11, and the group name, "AA" in this example, has been inputted in this area. At the middle portion, all the commands which constitute the group "AA", as well as their respective comments, are displayed. From these comments, the operator can positively be informed of the summary of the content of each executable command. When, after the desired command is discriminated, the operator designates the corresponding command name by way of the keyboard, at Step S126, the sequence goes to the execution step.

In this example, designation of the executable command is performed by typing a code or an abbreviation thereof. However, the system may be arranged so that numbers are assigned to the commands in the list shown in FIG. 11 and a desired command is designated by designating its number.

In accordance with this feature of the present invention, as has hitherto been described, the executable commands can be classified into groups, and this can be done by the user. Further, one and the same executable command may be defined as a member of each of different groups. Also, the group name can be determined as desired. Therefore, if the executable commands are classified in accordance with different references such as, for example, function, unit of hardware, nature of human being who is going to manipulate the apparatus (operator, maintenance staff, engineer, etc.), any desired command can be very quickly found out. That is, the research for a desired command can be made simply by designating one of different group names, all of which include the same desired command as a member.

In accordance with this feature of the present invention, as described, any desired command can be easily found out, and confirmation of the content thereof is also attainable. As a result, the possibility of mishandling is significantly suppressed. Further, the confirmation of any desired command is attainable only by handling the console in a very simple manner as described hereinbefore. The operator may not need to refer to the manual.

Referring now to FIGS. 12-16, third and fourth features of this embodiment of the present invention will be described.

According to these features of the present embodiment, the unit operations of the apparatus as described hereinbefore are hierarchically classified into the following classes:

(1) Operations determined by the type of semi-conductor device
(2) Operations determined by the process
(3) Operations determined by the shot.

And, among a large number of operation parameters, major ones (those which will be changed by the user at a high frequency) are classified into groups (or subclasses) related to the hierarchically classified classes of unit operations.

As an example, the hierarchic classification of the operational parameters can be made in the following manner:

Upper Class

The operational parameters determined by the type of the semiconductor devices (i.e. the parameters concerning the layout).

For example, the amount of unit step-feeding of the X-Y stage, the number of rows and columns, etc.

Middle Class

The operational parameters determined by the process (i.e. the parameters concerning the process).

For example, mode (distinction as to the first mask mode, the second mask mode and so on; distinction as to the TTL (Through The Lens) die-by-die alignment mode, the TTL global alignment mode; etc.), the reticle No., the position of an alignment mark, the location of the TV prealignment station, etc.

Lower Class

The operational parameters determined by the shot (i.e. the parameters concerning each shot).

For example, the exposure time, the manner of control of the masking blade (distinction as to exposure for an actual circuit pattern, exposure for a test chip, exposure for a TV prealignment mark, etc.), etc.

The hierarchic classification made in the manner described above is illustrated in FIG. 16. That is, the major ones of the operational parameters are classified in the manner described above, and those concerning the type of the semiconductor device are stored into layout files L1, L2, L3, ... Ln; the parameters concerning the process are stored into process files P1, P2, P3, ... Pm; and the parameters concerning the shot on the wafer are stored into shot files S1, S2, ... Sx.

Referring to FIGS. 12-14C, the operation in accordance with the third and fourth features of the present embodiment will now be described in detail.

In the apparatus of the present embodiment, with respect to each of the hierarchic classes, a plurality of files having stored therein different operational parameters are first prepared. Then, one file is selected out of each of the hierarchic classes, and the thus selected files are combined into one job. Such job preparation processing is shown in the flow chart of FIG. 12.

In the apparatus shown in FIGS. 1 and 2, the command input waiting state is established upon completion of the initialization processing after the start of the apparatus, as described in the foregoing. That is, the console CPU 31 is held in its stand-by state waiting for input of instruction signals from the keyboard 12, while the main CPU 21 is held in its stand-by state waiting for signal application from the console CPU 31. When, in such state, a command for instructing job generation, "JOB" in this example, is inputted from the keyboard 12, the following job generation processing is initiated under the control of the console CPU 31.

Figure 12B:
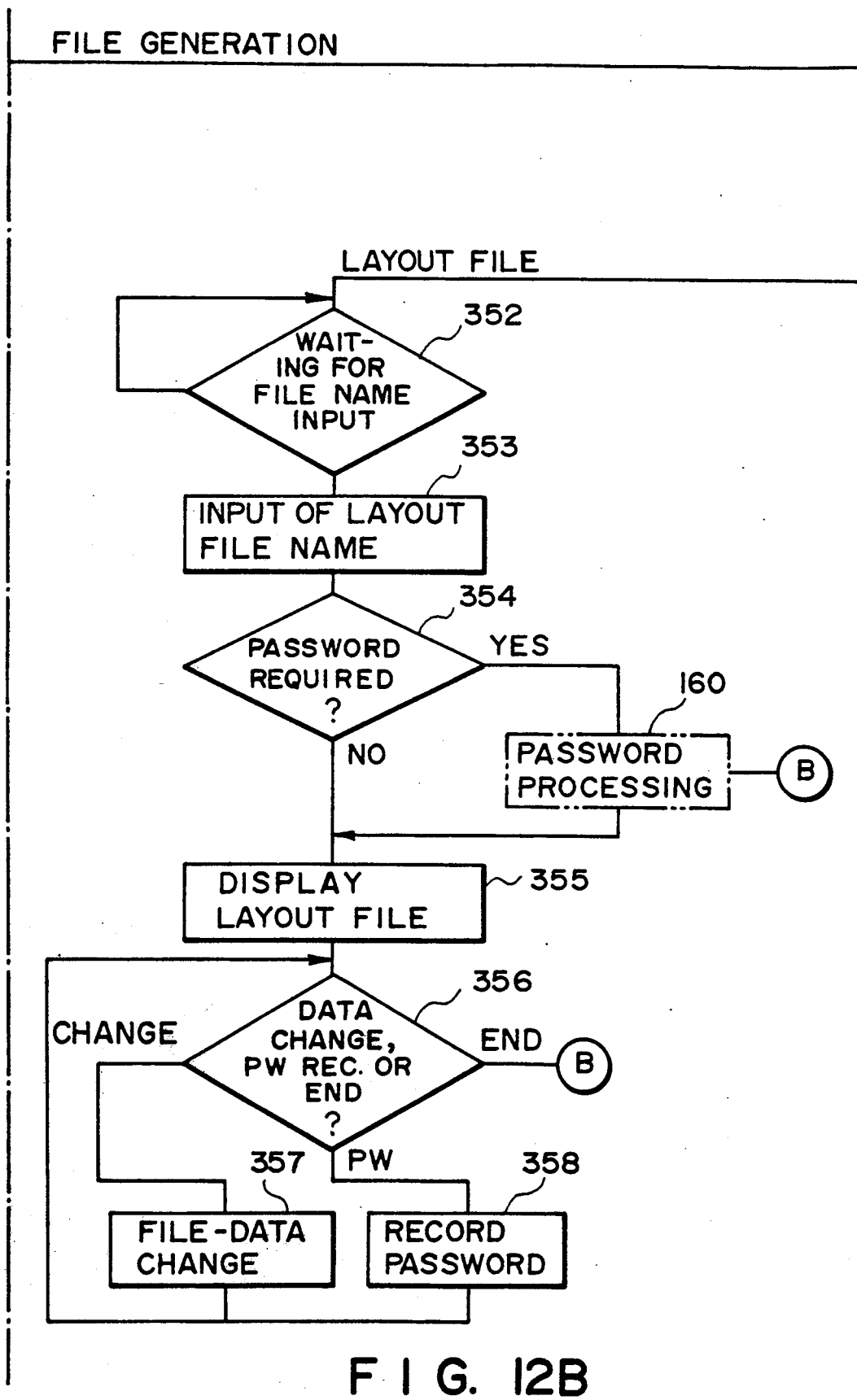
Figure 12C:
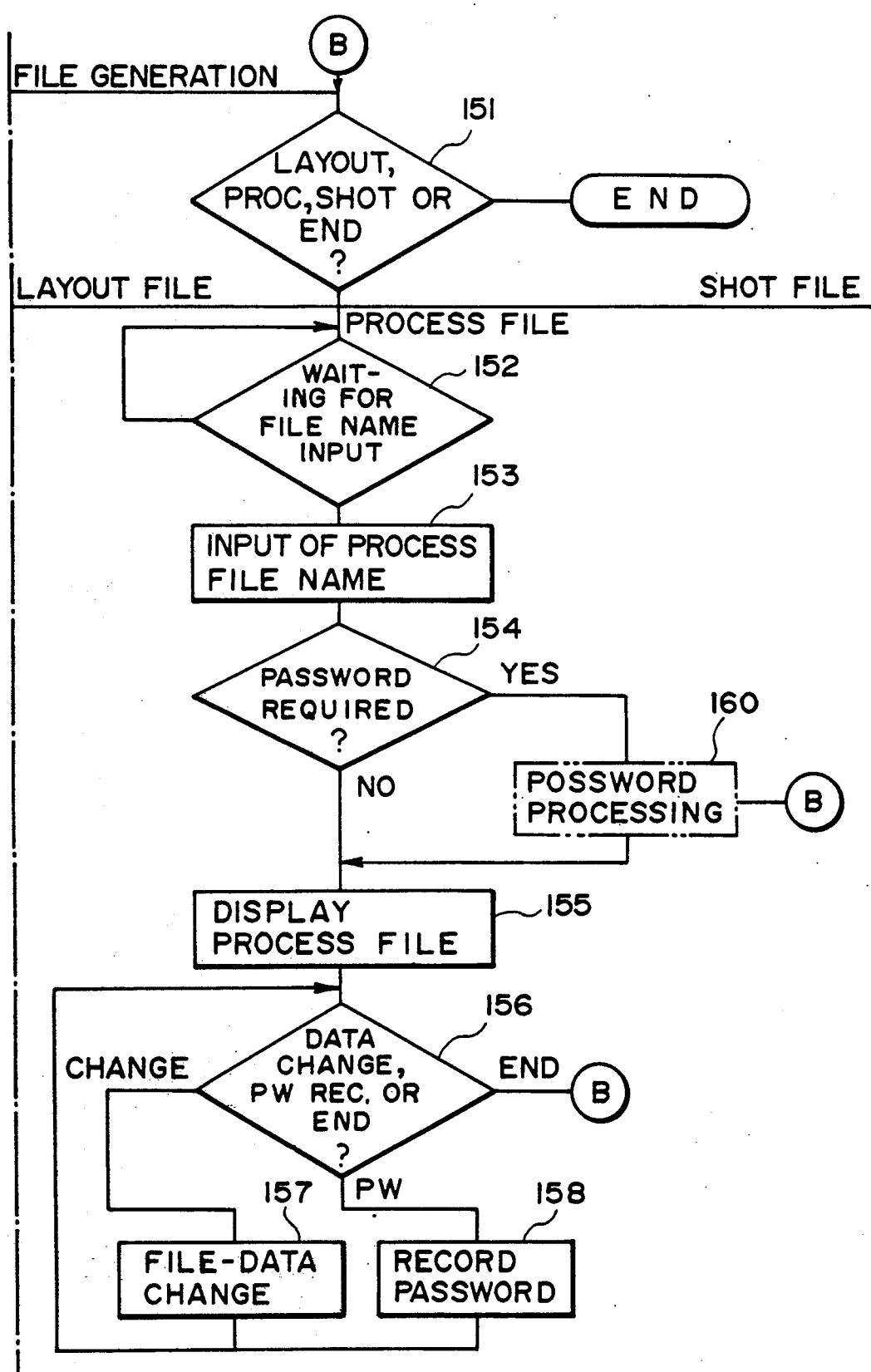

Referring to FIG. 12, at Step 150, the CRT 11 displays a prompt message which is given to the operator to urge selection of one of a file generation mode ("F/G" in this example), a file link mode ("F/L" in this example) and a job generation ending mode ("END" in this example), although the manner of display is not shown in the drawings. Upon selection by the operator, discrimination is made as to the selected mode on the basis of the data inputted from the keyboard.

When at Step 150 the file generation mode ("F/G") is selected, the sequence goes to Step 151. At Step 151, the display on the CRT 11 is changed to one shown in FIG. 13A, although the data in a phantom-line area 43 is not displayed. Then, a numeral or letter designated by the operator by way of the keyboard 12 is displayed in the phantom line area 43 of the picture plane of the CRT 11. After selection, the operator presses the line-feed key. In response thereto, discrimination is made as to which one of the three modes displayed on the CRT 11 (1: layout file, 2: process file, 3: shot file) and the file generation ending mode, is selected. In this example, the selection of mode can be effected by typing, on the keyboard, one of the numerals "1", "2" and "3" and the letter "E" (FIG. 13A).

When at Step 151 the process file generation mode is selected by the designation of numeral "2", the sequence proceeds to Step 152. At Step 152, a prompt message is displayed on the CRT 11, which is given to the operator to urge the input of the process file name. And, when the process file name is inputted from the keyboard 12, the corresponding file stored in the external memory 32 is researched and the corresponding process file is read out (Step 153). Further, discrimination is made at Step 154 as to whether the file is provided with a password (PW). If any password is provided, a password input processing comprising steps generally denoted by numeral 160 is executed, as will be described later. Then, the sequence goes to Step 155. If no password is provided, the sequence goes directly to the Step 155.

If at Step 153 such a file that corresponds to the file name designated by way of the keyboard is not stored in the external memory 32, it means that a new process file is to be generated. Therefore, the sequence goes directly to Step 155, as in the case of absence of password.

At Step 155, a picture such as shown in FIG. 13B is displayed on the CRT 11. That is, the data indicating the process file generation mode and the data concerning items to be changed or to be set, are displayed. Also, a prompt message is displayed, which is given to the operator so as to urge selection of the number of the item to be selected. When a particular one of the numbers of the items is selected, a prompt message such as shown in FIG. 13C is displayed, which is given to the operator to urge input of corresponding data of the selected item (Step 156). When an adequate data is inputted from the keyboard 12, appropriate processing for the file change or generation (Step 157), or alternatively, for the password change or setting (Step 158) is executed. Thereafter, the sequence goes back to Step 155. When the code "E" is inputted from the keyboard 12 at the time of Step 155, the process file generation mode is ended, whereby the sequence goes back to Step 151.

When at Step 151 the numeral "1" or "3" is designated by way of the keyboard, the processing according to the layout file generation mode or the shot file generation mode is executed. The processing in each of these modes is substantially the same as that of the above-described process file generation mode, except that the term "process" is replaced by a term "layout" or "shot" and that the data to be displayed and the items to be inputted are changed in accordance with the class in the hierarchic classification.

When at Step 150 the file link mode ("F/L") is selected, the sequence goes to Step 171. At Step 171, the CRT 11 displays a prompt message which is given to the operator to urge input of a job file name. When a particular job file name is designated by way of the keyboard (Step 172), the corresponding file stored in the external memory 32 is researched, and a corresponding job file is read out. Also, at Step 173, discrimination is made as to whether or not any password (PW) has been specified with respect to this file. If specified, the password input processing generally denoted by numeral 160 is executed and, thereafter, the sequence goes to Step 174. If not specified, the sequence goes directly Step 174. If, at Step 174, any file corresponding to the designated file name is not stored in the external memory 32, this means that a new job file is to be generated. So, the sequence goes directly to Step 174, as in the case of absence of password.

Figure 14A:
Figure 14B:
Figure 16:
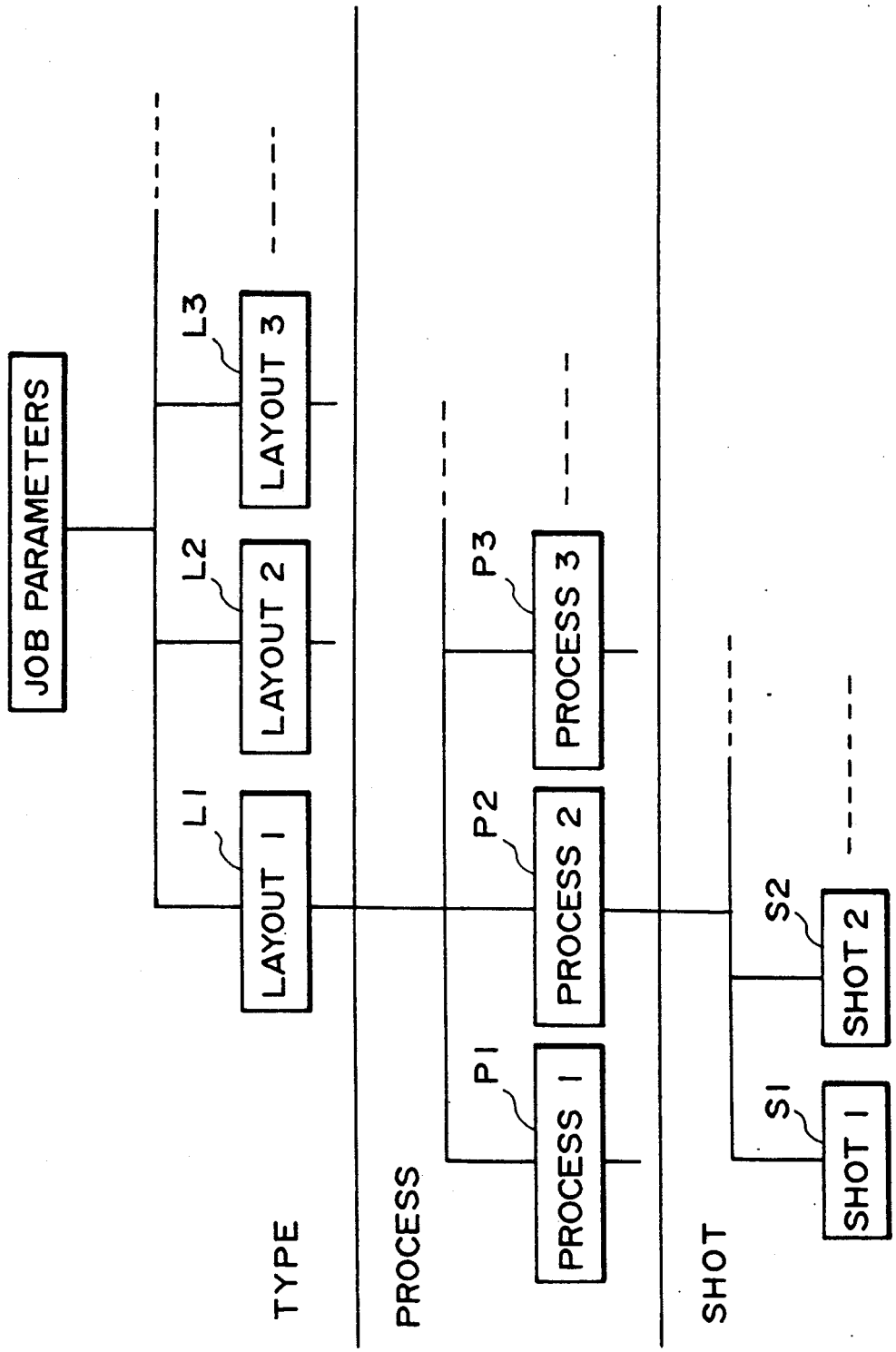
FIG. 16 is a schematic illustration for showing hierarchic classification of operational parameters, in accordance with the third feature of the present invention.

At Step 174, the CRT 11 displays the data indicating the file link mode (job file generation mode) and the data concerning the content of the job file read out of the external memory 32. Also, it displays a prompt message for the selection of an item to be changed or to be set, the selection to be made by the designation of the number of the item (FIG. 14A). When a particular item number is selected, a prompt message is displayed such as shown in FIG. 14B, the message being given to the operator to urge input of corresponding data for the selected item (Step 175). When adequate data is inputted from the keyboard 12, appropriate processing for the file change or generation (Step 176), or alternatively for the password change or setting (Step 177), is executed. Subsequently, the sequence goes back to Step 174. When, at Step 174, the code "E" is inputted from the keyboard 12, the file link mode is ended so that the sequence goes back to Step 150.

If, in each of the above-described file generation modes, a particular password is specified in the file (Step, 154 or 173), the password input processing at Step 160 is initiated. In this password processing, a prompt message for urging the operator's input of the corresponding password, is displayed in the CRT 11 (Step 161). When a certain password is inputted from the keyboard 12 (Step 162), it is compared with the password as read out at the earlier step (Step 163). If the inputted password is the same as that having been specified, the password processing is finished, and the sequence goes back to the original routine (Step 155 or 174). If the inputted password differs from that having been specified, indication of error is effected (Step 164) and, thereafter, the sequence goes to Step 165. At Step 165, the number of times of failure in password correspondence is counted. If the number is less than three, the sequence goes back to Step 161 so that the system is held again in its stand-by state waiting for input of the password. If, on the other hand, the number of times of failure becomes equal to three (Step 165), the sequence goes to Step 166 at which error indication is made and then the current file generation mode is cancelled. Thus, the sequence goes back to Step 150.

As described, in order to allow access to such a file in which a particular password is registered, input of the same password is required. If the correct password is not inputted, access to the file is inhibited. This is effective to prevent inadvertent renewing of the content of the file and thus, unwanted operation of the apparatus in accordance with the inadequate content of the file.

FIG. 15 shows the processing necessary for executing step-and-repeat exposure operation which is the major operation of the apparatus, in accordance with the file prepared in the manner described above.

When, in the command input waiting state, a start command (major operation starting command) and a particular job file name to be used in the major operation are inputted from the keyboard 12 (Step 181), the console CPU 21 is operated to research the corresponding file stored in the external memory 32 and reads a corresponding job file out of the external memory. Also, whether or not a particular password is specified in the file, is discriminated (Step 182). If specified, initiation of the command execution is suspended until a password corresponding to that specified in the job file, which is going to be used, is inputted from the keyboard 12 (Steps 183 and 184). If the correct password is inputted, the sequence goes to Step 185. If a password is not specified in the job file, the sequence, of course goes directly to Step 185.

At Step 185, only predetermined operational parameters are selected out of the content of the job file and they are displayed on the CRT 12. The selection of parameters to be displayed is determined on the basis of the possibility of data change by the operator. That is, the parameters which will be changed by the user or operator at a high frequency, will be selected. For example, the focus position ("FOCUS"), the exposure time ("EX. TIME"), etc. may have a high possibility of data change.

Subsequently, the operational parameter change (responsive to selection of mode "C") or the like is executed as desired. When, at Step 185, the major operation initiation is confirmed by the selection of mode "Y", the major operation is initiated. If, on the other hand, cancellation of a start of a major operation is selected at Step 185, by selecting mode "N", the apparatus is again placed in its command input waiting state.

In accordance with the third feature of this embodiment of the present invention, as has hitherto been described, the operational parameters are classified hierarchically with reference to the kind of unit operation, such as those concerning the type or kind of the semiconductor device to be manufactured, those concerning the process, those concerning the shot, and the like. Particularly, the parameters are classified in accordance with such operation units that will be set by the user in the apparatus very frequently. And, the thus classified parameters can be easily displayed as desired. Therefore, confirmation of a desired operational parameter or change thereto, more particularly, the confirmation or change to be made at the time of start of the major operation can be very easily effected. Moreover, a desired job comprising a desired combination of operational parameters can be very easily prepared, simply by designating desired parameter files.

Further, in accordance with the fourth feature of this embodiment, each operational parameter file may have a password as desired. As a result, inadvertent rewriting of the content of the file or incorrect operation of the apparatus due to designation of an incorrect file can be prevented.

Referring now to FIGS. 12 and 17A-19, a fifth feature of this embodiment of the present invention will be described in detail.

Referring again to FIG. 12, when at Step 151 the shot file generation mode is selected by the designation of the numeral "3" (FIG. 17A), the sequence goes to Step 252. At Step 252, a prompt message for urging the operator's input of a shot file name is displayed on the CRT 11. When a particular shot file name is designated by way of the keyboard 12, a corresponding file stored in the external memory 32 is researched and a corresponding shot file is read out (Step 253). Also, discrimination is made at Step 254 as to whether or not a particular password (PW) is specified in this file. If specified, a password input processing generally denoted at 160 and substantially the same as that having been described with reference to the file link mode, is executed. Then, the sequence proceeds to Step 255. If any password is not specified, the sequence goes directly to Step 255. If, at Step 253, any file corresponding to the designated file name is not stored in the external memory 32, this means that a new shot file is to be generated. Therefore, the sequence goes directly to Step 255, as in the case of absence of password.

At Step 255, a picture such as depicted in FIG. 17B is displayed on the CRT 11. That is, the data indicating the shot file generation mode and a prompt message for urging the operator's selection of one of a normal mode "N", a shot map generation mode "M" and a shot file generation processing ending mode "E", are displayed. As will be described later, the normal mode is one in which exposures relative to all the shots (or shot areas) are to be made under the same conditions, while the shot map generation mode is one for allowing exposures relative to the shots of one wafer under different conditions. The selection of mode is effected by typing on the keyboard a corresponding letter N, M or E. If the normal mode is selected, for example, by the designation of the letter "N" by way of the keyboard 12, the sequence goes to Step 256.

At Step 256, the display on the CRT 11 is changed to such as shown in FIG. 17C, and the data indicating the shot file generation mode and the data concerning items to be changed or to be set are displayed. Also, a prompt message for urging the operator's selection of one of the items is displayed. When a particular one of the item numbers, "1" in this example, is selected, the display on the CRT is changed to such as shown in FIG. 17D in which a prompt message for urging input of corresponding data for the selected item is displayed. When adequate data is inputted from the keyboard, appropriate processing for the file data change or file generation (Step 257) or, alternatively, for the password change or setting (Step 258) is executed in accordance with the inputted data. Thereafter, the sequence goes back to Step 256. When, at Step 256, a code "E" is inputted from the keyboard 12, the shot file generation mode is finished and the sequence goes back to Step 151.

Figure 17E:
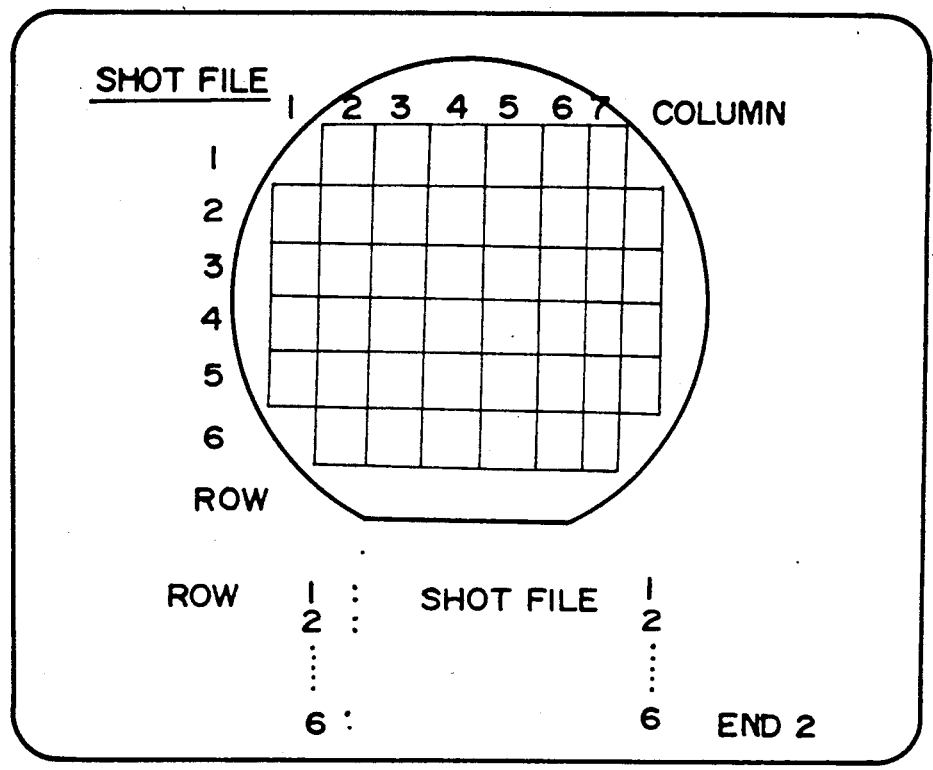

When, at Step 255, the shot map generation mode is selected by the designation of "M", the sequence goes to Step 259. At this time, a shot layout such as shown in FIG. 17E is displayed on the CRT 11. In this state, a particular shot file name is designated for row number 1, and another shot file name is designated for row number 2. In this manner, for the rows set for one wafer, individual shot file names are designated. By doing so, for each of the rows, an individual operational parameter can be determined. Similarly, different operational parameters can be determined with respect to different shots (shot areas), respectively. It is seen from FIG. 17E that the row number can be designated by a combination of a letter "R" with a numeral, the column number can be designated by a combination of a letter "C" with a numeral, and the shot number can be designated by a combination of a letter "S" with a numeral. It is a possible alternative to designate the shot number by characters "RmCn", with R corresponding to the row number, C corresponding to the column number, m and n being numerals.

When a code "E" is inputted, the shot map preparation mode is finished, so that the sequence goes back to Step 255. When, at Step 255, the letter "E" is typed on the keyboard 12, the shot file generation mode is finished whereby the sequence goes back to Step 151.

Figure 18A:
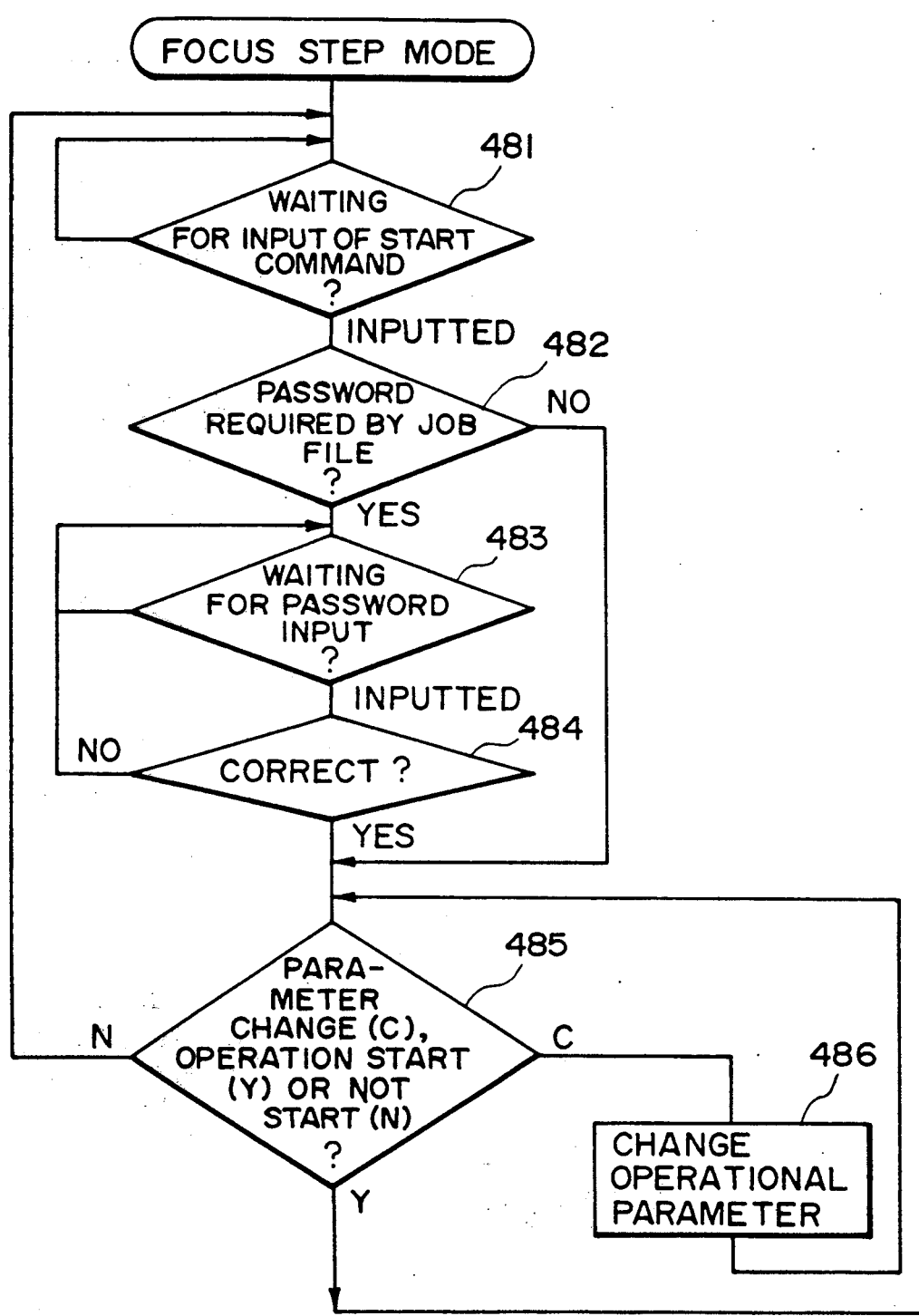
FIG. 18 and 18A–18B are a flow chart showing a focus step mode which is an example of an automatic sequence prepared in accordance with the fifth feature of the present invention.
Figure 18B:
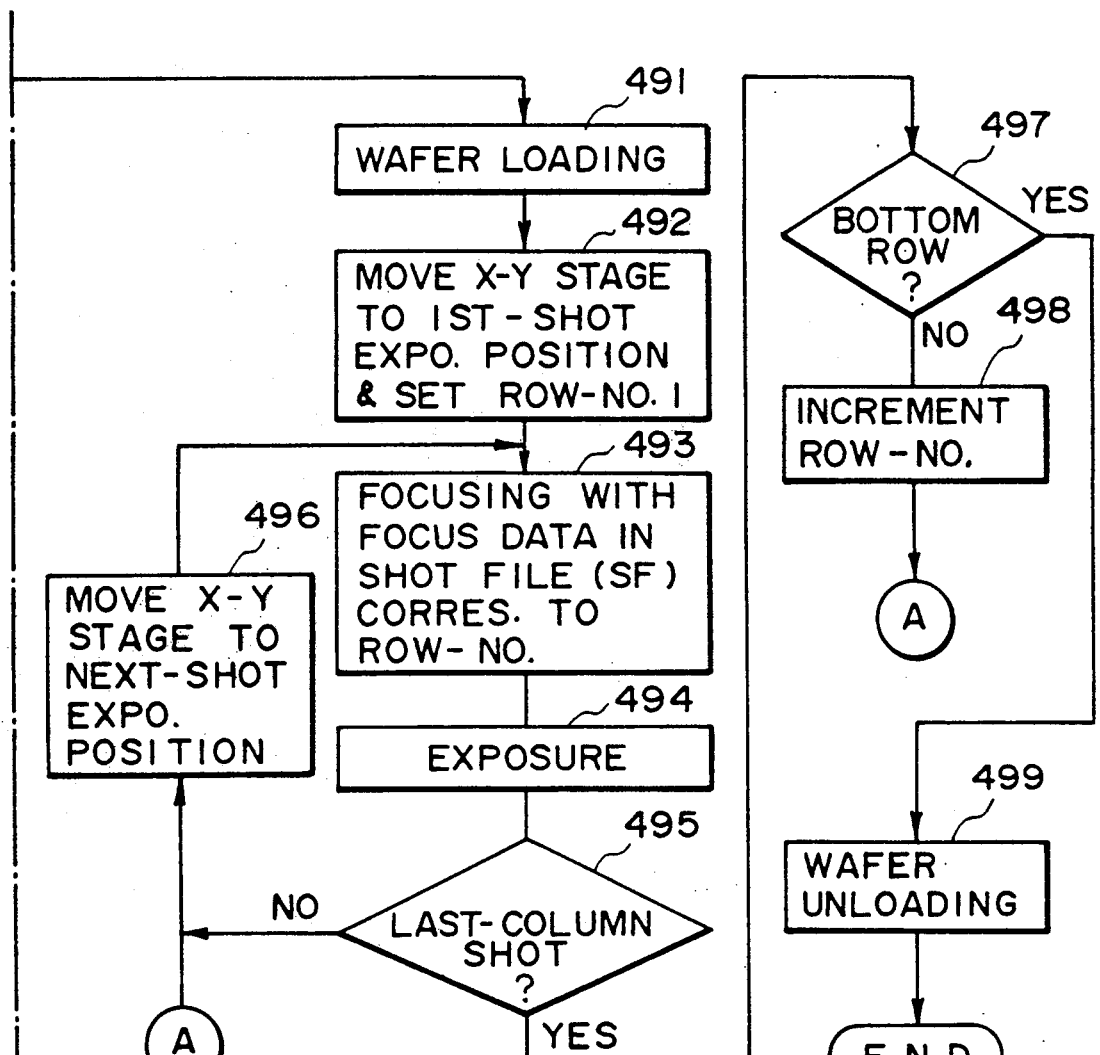
Figure 18:
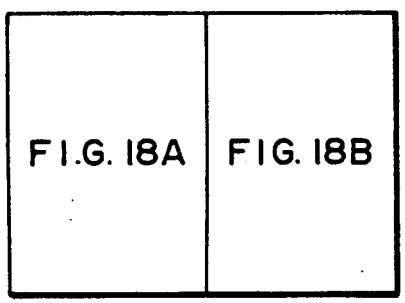

FIG. 18 is a flow chart showing the manner of execution of a special sequence, using a sequence file generated in accordance with the fifth feature of the present embodiment described above. In the example of FIG. 18, description will be made to a "Focal Step Mode" in which exposures are to be effected while sequentially moving the Z-stage from a "−1.0 micron" position to a "+1.5 micron" position at a constant pitch of 0.5 micron. Such a focus step mode is very effective to discriminate the optimum focusing position.

Figure 19:
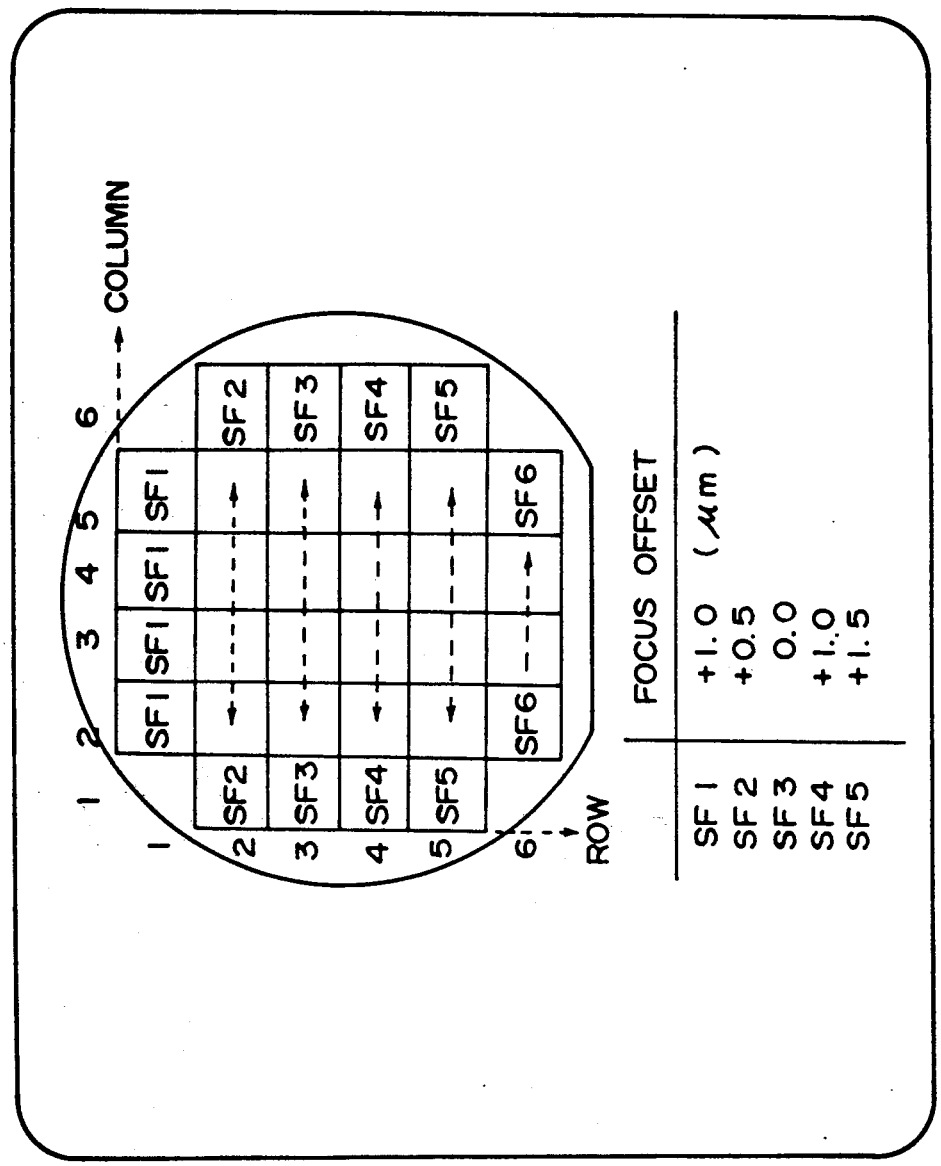
FIG. 19 shows an example of display on the cathode ray tube, corresponding to the operation of the focus step mode shown in FIG. 18.

When, in the command input waiting state as described, a start command (major operation starting command) and a particular job file name to be used in the execution of the aforesaid special sequence are inputted from the keyboard 12 (Step 481), the console CPU 21 is operated to search for a corresponding file stored in the external memory 32 and reads a corresponding job file out of the memory. Additionally, discrimination is made at Step 482 as to whether or not any password is specified in the file. If specified, advancement of the sequence is suspended until a password corresponding to that specified in the job file which is going to be used is inputted from the keyboard 12 (Steps 483 and 484). When the corresponding password is inputted, the sequence goes to Step 485. If any password is not specified, on the other hand, the sequence goes directly to Step 485. At Step 485, and if the designated job file contains a shot map file such as described in the foregoing, the content of the shot map file and a predetermined portion of the operational parameters, which are different with reference to the different shot areas, are displayed on the CRT 11 such as shown in FIG. 19. As for the particular parameters to be displayed, those which will be or may be changed by the user at a high frequency are displayed. The focus position, the exposure time, etc. are examples. Subsequently, as desired, the parameter change (responsive to selection of mode "C") or the like is executed. If, at Step 485, confirmation of start of the major operation is given by selecting mode "Y", the major operation which is, in this example, the focus step mode processing is initiated from Step 491. If, on the other hand, cancellation of a start of a major operation is designated by selecting mode "N" at Step 485, the apparatus is placed again into the command input waiting state.

The operations at Steps 491–499 shown in FIG. 18 are substantially the same as those which are to be made in accordance with the normal exposure mode, except that, at Step 493, individual parameters are set for the rows, respectively. Namely, first a wafer is loaded on the X-Y stage 5 (Step 491). Then, the X-Y stage 5 is moved so as to bring the first shot area to the exposure position (Step 492). At this time, the row number is set as "1". Subsequently, such a shot file that corresponds to this row number is read out, and the Z-stage is driven in accordance with the focus position data stored in the accessed shot file (Step 493). Then, the exposure is effected relative to the first shot area (Step 494). And, discrimination is made as to whether or not exposures relative to all the columns with respect to the current row number (i.e. "1") are completed (at Step 495). If not completed, the X-Y stage 5 is moved so as to bring the next shot area to the exposure position (Step 496). Thereafter, the sequence goes back to Step 493. At this time, the column number is incremented or decremented in accordance with the direction of movement of the X-Y stage. By such loop processing comprising the Steps 493–496, exposures relative to all the shot areas in one row can be accomplished.

When the exposures relative to all the columns with respect to one row are completed, the result of discrimination at Step 495 is "YES". Accordingly, the sequence goes to Step 497. At Step 497, discrimination is made as to whether or not exposures relative to the last row are completed. If completed, the wafer is unloaded from the X-Y stage 5 (Step 499) is moved back into a wafer cassette. If, on the other hand, the exposures relative to the last row are not completed, the row number is incremented, and the operations at Step 493 and the Steps following it are repeated.

In accordance with the fifth feature of the present embodiment, setting of operational parameters necessary for executing a particular unit operation can be effected, with respect to each of unit areas of a workpiece. That is, the parameter determination is attainable for each of the zones on a wafer or each of shot areas on the wafer. Additionally, the parameter determination for such a unit region can be made in a very simple manner. Moreover, once such a parameter determination is made, the unit operation with different operational parameters can be made relative to the whole surface of the workpiece completely automatically.

Figure 20:
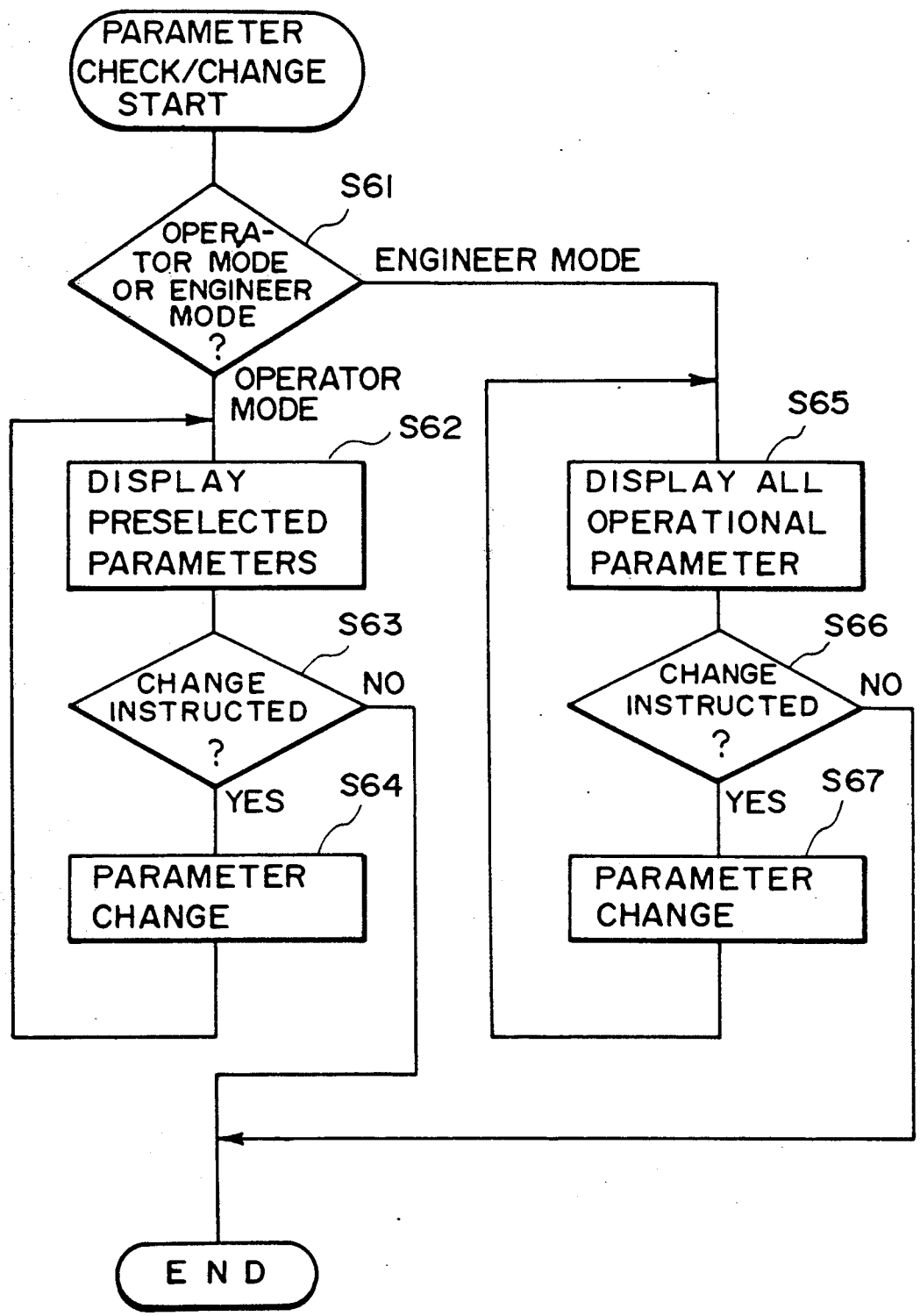
FIG. 20 is a flow chart showing the manner of parameter check-change operation, in accordance with a sixth feature of the present invention.

Referring now to FIGS. 20 and 21, a sixth feature of the present embodiment will be described in detail.

In the apparatus shown in FIGS. 1 and 2, as described, the command input waiting state is established at the time of completion of initialization processing after the start of the apparatus and at the time of completion of execution of a particular command. That is, the console CPU 31 is held in its stand-by state waiting for input from the keyboard 12, while the main CPU 21 is held in its stand-by state waiting for signal application from the console CPU 31. When in such a state, a command, "PD" in this example, instructing display of operational parameters is inputted from the keyboard 12, the following parameter displaying/display-changing operation is initiated under the control of the console CPU 31.

In accordance with this feature of the present embodiment, two display modes, an operator mode and an engineer mode, are prepared. At Step S61 in FIG. 20, a prompt message is displayed on the CRT 11, which is given to one who is manipulating the apparatus at this time. The prompt message is to urge selection of the display mode. When one of the display modes is selected, discrimination is made at Step S61 and on the basis of the data inputted from the keyboard 12, as to which one of the display modes is selected.

When the operator mode is selected at Step S61, only a predetermined portion of a large number of operational parameters stored in the external memory 32 is displayed on the CRT 11 (Step S62). The kinds of parameters to be displayed in the operator mode may be set at the side of the maker of the apparatus or, alternatively, may be made changeable at the side of the user. In this example, they are set by the maker. Simultaneously with the display of operational parameters, a prompt message for urging input of an item number with respect to which data change (parameter change) is to be made, or input of a code "E" instructing finish of the processing. At this time, the picture displayed on the CRT 11 is such as shown in an upper portion D1 of FIG. 21. It is seen in this figure that, a command input area is defined at the top of the picture plane D1, and the commands inputted from the keyboard 12 into the main CPU are displayed in such an area, thus allowing monitoring of the inputted commands. In this example, a command name "OP" is displayed in the command input area. And, in this example, this corresponds to a command which allows parameter change in the operator mode. Item numbers "1", "2" and "3" depicted in the picture D2 to be subsequently displayed on to the display D1, respectively correspond to the operational parameters which are to be displayed in the operator mode described above.

These parameters are selected, because there is a high possibility that they are changed by the user. Accordingly, by displaying these parameters on the CRT 11 after the input of the parameter display command, the operator is allowed to check the most important parameters. Therefore, the possibility of execution of the major operation such as a photoprinting operation with an unwanted parameter or parameters can be avoided. Further, the parameters displayed are those which will be often changed by the operator and do not include a reference which is not necessary for the operator. Therefore, the number of the parameters displayed is not so large, with the result that easy and quick checking of the parameters is allowed.

It is a possible alternative that as the parameters to be displayed, those used in the last-effected exposure operation (photoprinting operation) are selected. By doing so, the parameter change is required only in such a case where the exposure conditions are to be changed in response to the change in process or the like. This is very convenient.

A set of characters "CHANGE NO. OR END ?" displayed in the bottom portion of the picture plane D1 of FIG. 21 is a prompt message for urging input of the item number, with respect to which the data change is desired, or input of a code ending the processing. If, of the parameters displayed, any one is desired to be changed, the corresponding item number is typed on the keyboard 12. In the example of picture D1, the item "3" corresponds to the parameter for the exposure time which is, in this example, 200 ms. If, for example, the number "3" is designated by way of the keyboard as the designation of the data to be changed (Step S63), the display on the CRT 11 is changed to one shown in the middle portion D2 of FIG. 21. A set of characters "EXPOSURE TIME 200 ms" at the bottom of the picture D2 represent the current value of the operational parameter corresponding to the item "3", and shows that the data concerning this item is going to be changed. This current value has been stored in the external memory 32. To change the value "200 ms", new data to be set is inputted from the keyboard (Step S64). In this example, a numeral "150" is typed on the keyboard so as to change the exposure time to "150 ms". As a result, the exposure time is changed and the display on the CRT 11 is changed to such as depicted in the lower portion of FIG. 21 (although the code "E" is not displayed at this time). If a further parameter change is desired, the above-described parameter changing operation is repeated (Steps S2 and the like). To terminate the parameter changing operation, an ending code "E" is inputted in the state of picture D3. By this, the parameter display mode is finished and the apparatus is placed again in the command input waiting state.

If, at Step S61, the engineer mode is discriminated, similar operations as those of the operator mode steps S62-S64 are effected at Steps S65-S67. What is distinct from the operator mode is that, in the engineer mode, all the operational parameters which are open to the user are displayed and that these parameters can be changed as desired.

As described hereinbefore, the operational parameters to be displayed in the operator mode are those which will be often changed by the operator. Thus, according to this feature of the present invention, the operator can easily check these important parameters in the display of the CRT. Moreover, if the parameter change is desired, it is not necessary to research a desired parameter, to be changed, out of an extraordinarily large number of operational parameters in the list., Therefore, the parameter change can be accomplished very easily and quickly. Since the number of the parameters to be displayed is not so large, the possibility of an occurrence of mishandling is significantly reduced.

While, in the disclosed example, two display modes, the operator mode and the engineer mode, are set, the manner of selection of the display mode is not limited thereto. For example, plural display modes may be set for individual operators or, alternatively, plural display modes may be set in accordance with the level in skill or the like.

Also, in the disclosed example, the kind of major operation (job name), the focus position and the exposure time are selected as the operational parameters to be displayed in the operator mode. This is because of the fact that, in the projection type exposure apparatus, the operational parameters with respect to which the operator's check and the data change are often required, are these three parameters. As for the other operational parameters, there is only a little necessity for the operator to check them and/or to make data change relative to them. Of course, however, the determination of the kinds of the parameters to be displayed may be changed as desired. In the present embodiment, this is easily attainable by changing the program to be executed by the console CPU.

Further, in the disclosed example, the display command is manually inputted by the operator or the like. However, the system may be arranged so that the parameter display is initiated automatically. For example, the system may be arranged so that the sequence described with respect to this feature of the present invention is executed automatically in response to input of a particular command. And, this is easily attainable by changing the program.

In accordance with the sixth feature of the present embodiment, most important operational parameters can be displayed, separately from the other operational parameters, when it is desired. As a result, checking relative to such important parameters is very easily and quickly attainable and, also, can be very stably effected. Moreover, data change to such important parameters is easily attainable. Particularly, the parameter change in accordance with this feature of the present invention avoids the necessity of researching a desired parameter out of an extraordinarily large number of operational parameters.

Figure 22:
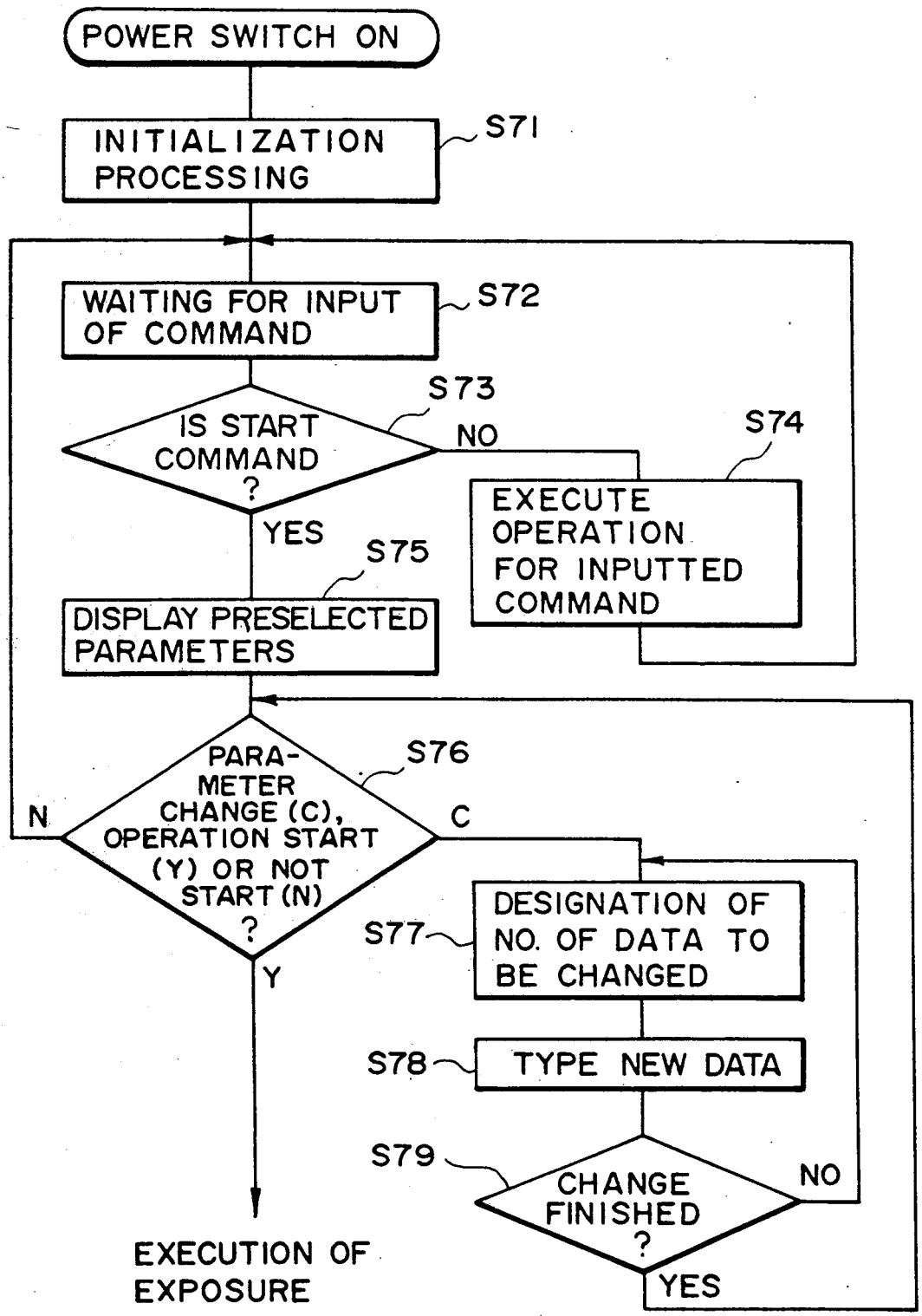
FIG. 22 is a flow chart showing the manner of parameter confirmation upon start of the apparatus, in accordance with a seventh feature of the control system of the FIG. 2 embodiment.
Figure 23:
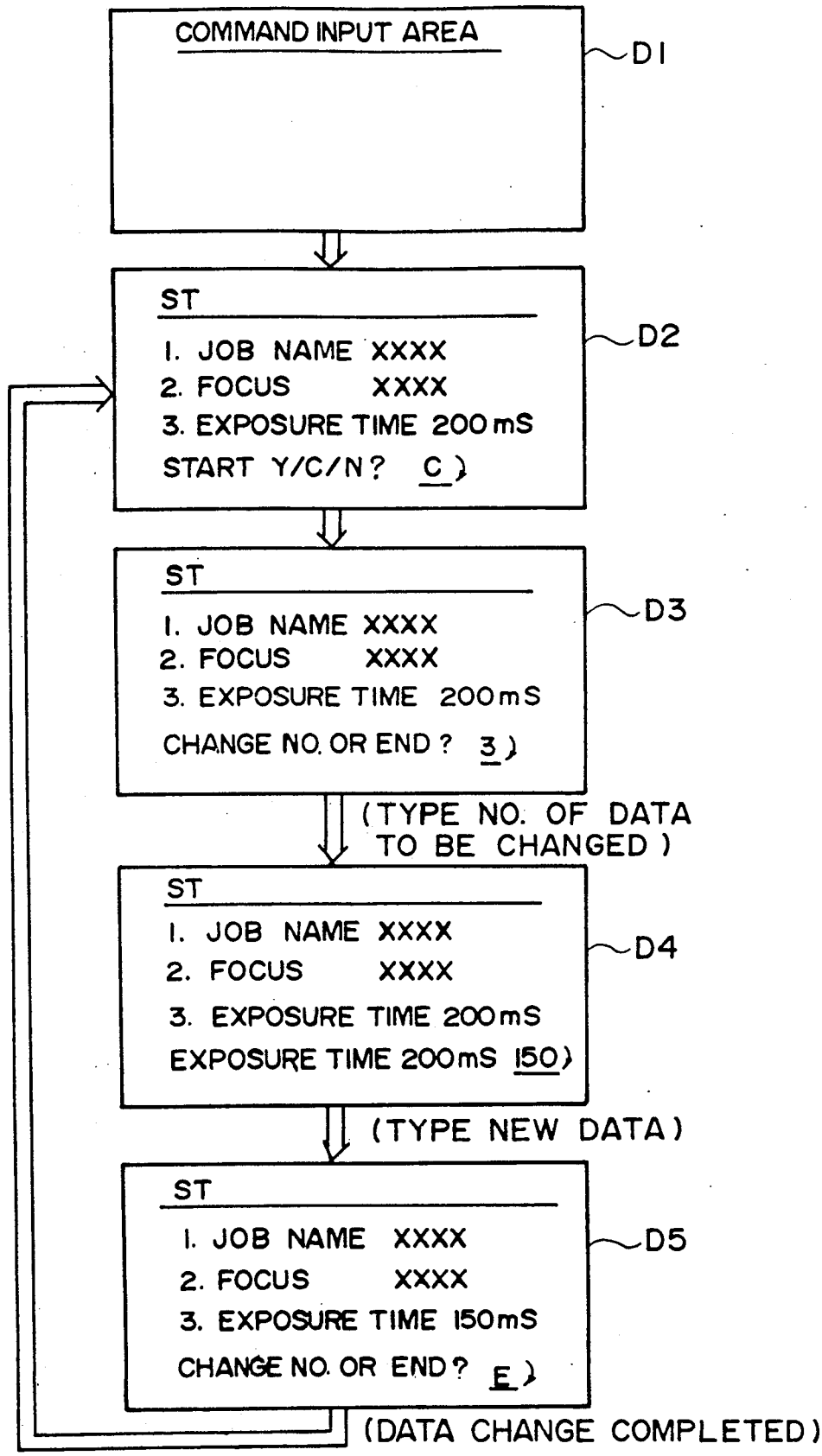
FIG. 23 is a schematic illustration for showing an example of sequential display on the cathode ray tube, corresponding to the operation of FIG. 22.

Referring now to FIGS. 22 and 23, a seventh feature of the present embodiment will now be described. In the apparatus shown in FIGS. 1 and 2, as described, the console CPU 31 and the main CPU 21 execute initialization processing in response to input of power to the apparatus (Step S71). And, the console unit 30 is brought into a command input waiting state (Step S72). In this state, the display on the CRT 11 is such as shown in a top portion D1 of FIG. 23. As shown, the picture plane D1 of the CRT 11 has a command input area defined at the top, which area allows monitoring of the command or commands inputted into the apparatus from the keyboard 12. The console CPU 31 is operative to discriminate whether the command inputted from the keyboard 12 is a start command (major operation starting command) or not (Step S73). If not the start command, appropriate processing corresponding to the inputted command is executed (Step S74). Subsequently, the console CPU 31 is brought again into the command input waiting state (Step S72). When the start command is inputted, only a predetermined portion of a large number of parameters stored in the external memory is displayed on the CRT 11 (Step S75). The display on the CRT 11 at this time is such as depicted as a picture D2 in FIG. 23. In the picture D2, the characters "ST" at the top of the picture plane D2 denote the start command inputted into the command input area. The predetermined parameters are displayed in the middle of the picture plane D2.

These predetermined parameters are those with respect to which the operator will often make data change upon initiation of the major operation. According to this feature of the present embodiment, in consideration of the above, such predetermined parameters are automatically displayed in response to input of the start command, such as depicted in the picture plane D2. This allows the operator to check the important operational parameters upon start of the processing and, as a result of which, avoids the possibility of incorrect operation under unwanted conditions. Also, since the number of the operational parameters to be displayed is not large, checking of these parameters is very easy.

At the bottom of the picture D2, a prompt message urging selection of a mode to be subsequently executed is displayed. When, at Step S76 corresponding to the display D2, a code "Y" is selected, the major operation which is, in this example, the step-and-repeat exposure operation, is initiated in accordance with the parameters displayed. If a code "N" is selected, the system is brought again into the command input waiting state (Step S72). When a code "C" is selected, the parameter change processing at Step S77 is executed. In this parameter change processing, first, a prompt message urging designation of the item number with respect to which the parameter change is desired. The display on the CRT 11 at this time is such as depicted as a picture D3 in FIG. 23. The item number "3" designates the exposure time which is, in this example, 200 ms. A set of characters "CHANGE NO. OR END ?" at the bottom of the picture D3 is the prompt message. When, in this state, the number "3" is designated by way of the keyboard as the data change item (Step S77), the display on the CRT is changed to such as depicted as a picture D4 in FIG. 23. A set of characters "EXPOSURE TIME 200 ms" at the bottom of the picture D4 denote the current value of the operational parameter corresponding to the item "3". Also, it indicates that the operational parameter of this item is going to be changed. The value "200 ms" is one that has been stored in the external memory 32. To change this value, new data to be set is inputted from the keyboard (Step S78). In this example, a numeral "150" is typed on the keyboard so as to change the exposure time to "150 ms". As a result, the exposure time is changed, and the display on the CRT 11 at this time is such as depicted as a picture D5 (although the code "E" is not displayed). If further parameter change is desired, the above-described parameter changing operation is repeated (Steps S77 and so on). Also, to finish the parameter changing operation, the code "E" is inputted in the state of the display D5, whereby the sequence goes back to Step S76 and the display is changed back to such as denoted at D2.

As described in the foregoing, the operational parameters which are automatically displayed upon start of the apparatus are those which will be often changed by the operator. Therefore, on the CRT 11, the operator can easily check such important parameters. Moreover, if data change is desired for such a parameters, it is not necessary to research such desired parameter out of an extraordinarily large number of operational parameters in the list. As a result, the parameter change is very easily and quickly attainable.

In accordance with this feature of the present embodiment, the major operation is not initiated unless appropriateness of important operational parameters is confirmed by the operator. By doing so, the possibility of occurrence of incorrect operation under unwanted conditions is avoided.

While the invention has been described with reference to the structures disclosed herein, it is not confined to the details set forth and this application is intended to cover such modifications or changes as may come within the purposes of the improvements or the scope of the following claims.

What is claimed is:

1. A fine pattern printing apparatus for use in the manufacture of semiconductor microcircuits, for printing fine patterns on different shot areas on a workpiece in accordance with one of a plurality of processes, said apparatus comprising:
   printing means for printing fine patterns on the shot area on the workpiece in a predetermined order in accordance with one of a plurality of processes;
   parameter setting means for setting a plurality of operational parameters related to the printing operation of said printing means;
   file setting means for setting a plurality of files each including a selective combination of the operational parameters, (i) wherein the operational parameters are hierarchically classified into different classes with respect to the pattern, the process and the shot area, (ii) wherein the operational parameters in each class are further classified into different subclasses on the basis of a corresponding one of the difference in type, the difference in process and the difference in shot area, and (iii) wherein said file setting means registers the operational parameters in each subclass in the form of a file; and
   job setting means for selectively combining files, set by said file setting means, to determine a job to be executed by said printing means.

2. An exposure apparatus for sequentially exposing, in a step-and-repeat manner, different shot areas of a semiconductor wafer to an exposure beam passed through a mask to thereby print a pattern of the mask, prepared for manufacture of integrated circuits, on the shot area of the wafer, said apparatus comprising:
   an exposure unit for sequentially exposing the shot areas of the wafer to the exposure beam passed through the mask, said exposure unit comprising:
   a mask stage for holding the mask;
   a wafer stage for holding the wafer;
   a wafer stage driving system for moving said wafer stage along an X-Y plane;
   a Z-axis driving system for moving the wafer held by said wafer stage in a Z-axis direction;
   an alignment detecting system for use in positioning at least one of the mask held by said mask stage and the wafer held by said wafer stage, with respect to the X-Y plane;
   a Z-axis position detecting system for use in positioning the mask held by said mask stage and the wafer held by said wafer stage, with respect to the Z-axis direction;
   an exposure control system for controlling the exposure of the wafer held by said wafer stage to the exposure beam passed through the mask held by said mask stage; and
   an exposure-unit-side central processing unit for controlling each of said wafer stage driving system, said Z-axis driving system, said alignment detecting system, said Z-axis position detecting system, and said exposure control system, in accordance with at least one of an applied command and an applied parameter, to thereby execute sequential exposures, in the step-and-repeat manner, of the shot areas of the wafer to the exposure beam passed through the mask; and
   a console unit for applying, to said exposure-unit-side central processing unit, at least one of a command and a parameter related to the operation of each of said systems of said exposure unit, said console unit comprising:
   a keyboard;
   a display, operable upon input from said keyboard of a command to prepare an operational sequence for said exposure unit, for displaying a first mode for registering a file name of the operational sequence, a second mode for registering a comment related to the operational sequence, and a third mode for preparing the operational sequence, to provide for selection of one of the first through third modes;
   a memory for storing, into a corresponding area thereof, one of (i) the file name input from said keyboard when the first mode is selected, (ii) the comment input from said keyboard when the second mode is selected, and (iii) the operational sequence prepared when the third mode is selected; and
   a console-unit-side central processing unit, responsive to an input of a file name registered in said memory from said keyboard during a command input waiting period, for reading an operational sequence, corresponding to the input file name, out of said memory, and for transmitting data corresponding to the read-out operational sequence to said exposure-unit-side central processing unit.

3. An apparatus according to claim 2, wherein the operational sequence includes an execution command related to a corresponding operation of said exposure unit and a statement for designating the number of repetitions of the execution command.

4. An apparatus according to claim 3, wherein the operational sequence is related to the operation of said Z-axis position detecting system and to the operation of said Z-axis driving system.

5. An exposure apparatus for sequentially exposing, in a step-and-step manner, different shot areas of a semiconductor wafer to an exposure beam passed through a mask to thereby print a pattern of the mask, prepared for manufacture of integrated circuits on the shot areas of the wafer, said apparatus comprising:
   an exposure unit for sequentially exposing the shot areas of the wafer to the exposure beam passed through the mask, said exposure unit comprising:
   a mask stage for holding the mask;
   a wafer stage for holding the wafer;
   a wafer stage driving system for moving said wafer stage along an X-Y plane;
   a Z-axis driving system for moving the wafer held by said wafer stage in a Z-axis direction;
   an alignment detecting system for use in positioning at least one of the mask held by said mask stage and the wafer held by said wafer stage, with respect to the X-Y plane;
   a Z-axis position detecting system for use in positioning the mask held by said mask stage and the wafer held by said wafer stage, with respect to the Z-axis direction;
   an exposure control system for controlling the exposure of the wafer held by said wafer stage to the exposure beam passed through the mask held by said mask stage; and
   an exposure-unit-side central processing unit for controlling each of said wafer stage driving system, said Z-axis driving system, said alignment detecting system, said Z-axis position detecting system, and said exposure control system, in accordance with at least one of an applied command and an applied parameter, to thereby execute sequential exposures, in the step-and-repeat manner, of the shot areas of the wafer to the exposure beam passed through the mask; and a console unit for applying, to said exposure-unit-side central processing unit, at least one of a command and a parameter related to the operation of each of said systems of said exposure unit, said console unit comprising:

a keyboard;

a display, operable upon input from said keyboard of a command to define a group of execution commands, for displaying a first mode for changing a name of the group and a second mode for changing an execution command to be included in the group, to provide for selection of one of the first and second modes, said display also being operable when the second mode is selected for displaying a first option for adding an additional execution command to the group and a second option for deleting an execution command from the group, to provide for selection of one of the first and second options;

a memory for storing definition data of the group related to the changed execution command, when the second mode is selected; and a console-unit-side central processing unit, responsive to an input of an execution command from said keyboard during a command input waiting period, for causing a corresponding system to execute an operation corresponding to the input execution command, said console-unit-side central processing unit also being responsive to an input of a group name registered in said memory, for reading all execution commands included in the input group name out of said memory an for causing said display to display those commands, together with their related comments, in a single picture.

6. An exposure apparatus for sequentially exposing, in a step-and-repeat manner, different shot areas of a semiconductor wafer to an exposure beam passed through a mask to thereby print a pattern of the mask, prepared for manufacture of integrated circuits, on the shot areas of the wafer, said apparatus comprising:

an exposure unit for sequentially exposing the shot areas of the wafer to the exposure beam passed through the mask, said exposure unit comprising:

a mask stage for holding the mask;

a wafer stage for holding the wafer;

a wafer stage driving system for moving said wafer stage along an X-Y plane;

a Z-axis driving system for moving the wafer held by said wafer stage in a Z-axis direction;

an alignment detecting system for use in positioning at least one of the mask held by said mask stage and the wafer held by said wafer stage, with respect to the X-Y plane;

a Z-axis position detecting system for use in positioning the mask held by said mask stage and the wafer held by said wafer stage, with respect to the Z-axis direction;

an exposure control system for controlling the exposure of the wafer held by said wafer stage to the exposure beam passed through the mask held by said mask stage; and an exposure-unit-side central processing unit for controlling each of said wafer stage driving system, said Z-axis driving system, said alignment detecting system, said Z-axis position detecting system, and said exposure control system, in accordance with at least one of an applied command and an applied parameter, to thereby execute sequential exposures, in the step-and-rear manner, of the shot areas of the wafer to the exposure beam passed through the mask; and a console unit for applying, to said exposure-unit-side central processing unit, at least one of a command and a parameter related to the operation of each of said systems of said exposure unit, said console unit comprising:

a keyboard;

a display, operable after input from said keyboard of a command to prepare a job to be executed in said exposure unit, for displaying a first mode for at least one of changing and preparing an operational parameter related to layout of the wafer to be processed by said exposure unit, a second mode for at least one of changing and preparing an operational parameter related to a process for the wafer to be processed by said exposure unit, and a third mode for at least one of changing and preparing an operational parameter related to each shot area of the wafer to be processed by said exposure unit, to provide for selection of one of the first through third modes;

a memory for storing one of (i) a layout parameter input from said keyboard, together with its file name, when the first mode is selected, (ii) a process parameter input from said keyboard, together with its file name, when the second mode is selected, and (iii) a shot parameter input from said keyboard, together with its file name, when the third mode is selected; and a console-unit-side central processing unit, responsive to an input of a job name registered in said memory from said keyboard during a command input waiting period, for reading operational parameters corresponding to the input job name out of said memory.

7. An apparatus according to claim 6, wherein said display displays a file name of a layout parameter included in a job selected in accordance with the input from said keyboard, a file name of process parameter, and a file name of a shot parameter, when said console-unit-side central processing unit is in a file-link mode.

8. An apparatus according to claim 7, wherein each file name displayed by said display can change, based on an input from said keyboard.

9. An exposure apparatus for sequentially exposing, in a step-and-repeat manner, different shot areas of a semiconductor wafer to an exposure beam passed through a mask to thereby print a pattern of the mask, prepared for manufacture of integrated circuits, on the shot areas of the wafer, said apparatus comprising:

an exposure unit for sequentially exposing the shot areas of the wafer to the exposure beam passed through mask, said exposure unit comprising:

a mask stage for holding the mask;

a wafer stage for holding the wafer;

a wafer stage driving system for moving said wafer stage along an X-Y plane;

a Z-axis driving system for moving the wafer held by said wafer stage in a Z-axis direction;

an alignment detecting system for use in positioning at least one of the mask held by said mask stage and the wafer held by said wafer stage, with respect to the X-Y plane;

a Z-axis position detecting system for use in positioning the mask held by said mask stage and the wafer held by said wafer stage, with respect to the Z-axis direction; p1 an exposure control system for controlling the exposure of the wafer held by said wafer stage to the exposure beam passed through the mask held by said mask stage; and an exposure-unit-side central processing unit for controlling each of said wafer stage driving system, said Z-axis driving system, said alignment detecting system, said Z-axis position detecting system, and said exposure control system, in accordance with at least one of an applied command and an applied parameter, to thereby execute sequential exposures, in the step-and-repeat manner, of the shot areas of the wafer to the exposure beam passed through the mask; and a console unit for applying, to said exposure-unit-side central processing unit, at least one of a command and a parameter related to the operation of each of said systems of said exposure unit, said console unit comprising:

a keyboard;

a display, operable upon selection from said keyboard of a map preparing mode for changing an operational parameter of said exposure unit for the exposure of each shot area of the wafer, for displaying a layout of the shot areas of the wafer, together with their row numbers and column numbers;

a memory for storing, in the form of a shot map file, an operational parameter set in units of a shot area or in units of a row, in accordance with an input from said keyboard; and a console-unit-side central processing unit, responsive to an input of a job file name, including a shot map file registered in said memory, from said keyboard during a command input waiting period, for reading an operational parameter corresponding to the input job file name out of said memory and for causing said display to display a quantity, among the read-out operational parameters, related to said Z-axis position detecting system and to said exposure control system, together with the shot layout.

10. An exposure apparatus for sequentially exposing in, a step-and-repeat manner, different shot areas of a semiconductor wafer to an exposure beam passed through a mask to thereby print a pattern of the mask, prepared for manufacture of integrated circuits, on the shot areas of the wafer, said apparatus comprising:

an exposure unit for sequentially exposing the shot areas of the wafer to the exposure beam passed through the mask, said exposure unit comprising:

a mask stage for holding the mask;

a wafer stage for holding the wafer;

a wafer stage driving system for moving said wafer stage along an X-Y plane;

a Z-axis driving system for moving the wafer held by said wafer stage in a Z-axis direction;

an alignment detecting system for use in positioning at least one of the mask held by said mask stage and the wafer held by said wafer stage, with respect to the X-Y plane;

a Z-axis position detecting system for use in positioning the mask held by said mask stage and the wafer held by said wafer stage, with respect to the Z-axis direction;

an exposure control system for controlling the exposure of the wafer held by said wafer stage to the exposure beam passed through the mask held by said mask stage; and an exposure-unit-side central processing unit for controlling each of said wafer stage driving system, said Z-axis driving system, said alignment detecting system, said Z-axis position detecting system, and said exposure control system, in accordance with at least one of an applied command and an applied parameter, to thereby execute sequential exposures, in the step-and-repeat manner, of the shot areas of the wafer to the exposure beam passed through the mask; and a console unit for applying, to said exposure-unit-side central processing unit, at least one of a command and a parameter related to the operation of each of said systems of said exposure unit, said console unit comprising:

a keyboard;

a display, operable upon input of a command from said keyboard for changing an operational parameter for said exposure unit in an operator mode, for displaying a name of a job related to the operational parameter to be changed, a parameter related to said Z-axis position detecting system, and a parameter related to said exposure control system;

a memory for storing a parameter having been changed in accordance with an input from said keyboard when said operator mode is selected; and a console-unit-side central processing unit, responsive to an input of a job name registered in said memory from said keyboard during a command input waiting period, for reading a parameter corresponding to the input job name our of said memory.

11. An exposure apparatus for sequentially exposing, in a step-and-repeat manner, different shot areas of a semiconductor wafer to an exposure beam passed through a mask to thereby print a pattern of the mask, prepared for manufacture of integrated circuits, on the shot areas of the wafer, said apparatus comprising:

an exposure unit for sequentially exposing the shot areas of the wafer to the exposure beam passed through the mask, said exposure unit comprising:

a mask stage for holding the mask;

a wafer stage for holding the wafer;

a wafer stage driving system for moving said wafer stage along an X-Y plane;

a Z-axis driving system for moving the wafer held by said wafer stage in a Z-axis direction;

an alignment detecting system for use in positioning at least one of the mask held by said mask stage and the wafer held by said wafer stage, with respect to the X-Y plane;

a Z-axis position detecting system for use in positioning the mask held by said mask stage and the wafer held by said wafer stage, with respect to the Z-axis direction;

an exposure control system for controlling the exposure of the wafer held by said wafer stage to the exposure beam passed through the mask held by said mask stage; and an exposure-unit-side central processing unit for controlling each of said wafer stage driving system, said Z-axis driving system, said alignment detecting system, said Z-axis position detecting system, and said exposure control system in accordance with at least one of an applied command and an applied parameter, to thereby execute sequential exposures, in the step-and-repeat manner, of the shot areas of the wafer to the exposure beam passed through the mask; and a console unit for applying, to said exposure-unit-side central processing unit, at least one of a command and a parameter related to the operation of each of said systems of said exposure unit, said console unit comprising:

a keyboard;

a display, operable upon input of a command from said keyboard for initiating an operation of said exposure unit, for displaying a name of a job related to the operation to be initiated, a parameter related to said Z-axis position detecting system, a parameter related to said exposure control system, and a prompt message for inducing a next input from said keyboard;

a memory for storing the parameters, together with their file name; and a console-unit-side central processing unit, responsive to an input of the command from said keyboard, for reading the parameters out of said memory.

12. AN exposure apparatus for sequentially exposing, in a step-and-repeat manner, different shot areas of a semiconductor wafer to a radiation beam passed through a mask, to thereby print a pattern of the mask, prepared for manufacture of integrated circuits, on the shot areas of the wafer, said apparatus comprising:

an exposure unit for sequentially exposing the shot areas of the wafer to the radiation beam passed through the mask, said exposure unit comprising:

a mask stage for holding the mask;

a wafer stage for holding the wafer;

a wafer stage driving system for moving said wafer stage along an X-Y plane;

a Z-axis driving system for moving the wafer held by said wafer stage in a Z-axis direction;

an alignment detecting system for relatively positioning the mask held by said mask stage and the wafer held by said wafer stage, with respect to the X-Y plane;

a Z-axis position detecting system for relatively positioning the mask held by said mask stage and the wafer held by said wafer stage, with respect to the Z-axis direction;

an exposure control system for controlling the exposure of the wafer held by said wafer stage to the radiation beam passed through the mask held by said mask stage; and an exposure-unit-side central processing unit for controlling each of said wafer stage driving system, said Z-axis driving system, said alignment detecting system, said Z-axis position detecting system and said exposure control system, in accordance with at least one of an applied command and an applied parameter, to thereby execute sequential exposures, in the step-and-repeat manner, of the shot areas of the wafer to the radiation beam passed through the mask; and a console unit for applying, to said exposure-unit-side central processing unit, at least one of a command and a parameter related to the operation of each of said systems of said exposure unit, said console unit comprising:

a display, operable upon input of a command for preparation of an operational sequence for said exposure unit, for selecting a first mode for registration of a file name of that operational sequence and a second mode for preparing that operational sequence;

a memory for storing therein an operational sequence prepared when the second mode is selected; and a console-unit-side central processing unit responsive to an input of a file name during a command input waiting period, for reading an operational sequence corresponding to the input file name out of said memory and for transmitting data corresponding to the read-out operational sequence to said exposure-unit-side central processing unit.

13. An exposure apparatus for sequentially exposing, in a step-and-repeat manner, different shot areas of a semiconductor wafer to a radiation beam passed through a mask, to thereby print a pattern of the mask, prepared for manufacture of integrated circuits, on the shot areas of the wafer, said apparatus comprising:

an exposure unit for sequentially exposing the shot areas of the wafer to the radiation beam passed through the mask, said exposure unit comprising:

a mask stage for holding the mask;

a wafer stage for holding the wafer;

a wafer stage driving system for moving said wafer stage along an X-Y plane;

a Z-axis driving system for moving the wafer held by said wafer stage in a Z-axis direction;

an alignment detecting system for relatively positioning the mask held by said mask stage and the wafer held by said wafer stage, with respect to the X-Y plane;

a Z-axis position detecting system for relatively positioning the mask held by said mask stage and the wafer held by said wafer stage, with respect to the Z-axis direction;

an exposure control system for controlling the exposure of the wafer held by said wafer stage to the radiation beam passed through the mask held by said mask stage; and an exposure-unit-side central processing unit for controlling each of said wafer stage driving system, said Z-axis driving system, said alignment detecting system, said Z-axis position detecting system and said exposure control system, in accordance with at least one of an applied command and an applied parameter, to thereby execute sequential exposures, in the step-and-repeat manner, of the shot areas of the wafer to the radiation beam passed through the mask; and a console unit for applying, to said exposure-unit-side central processing unit, at least one of a command and a parameter related to the operation of each of said systems of said exposure unit, said console unit comprising:

a display, operable upon input of a command for defining a group of execution commands, for selecting a first mode for changing a name of the group and a second mode for changing the execution commands to be included in that group, said display also being operable when the second mode is selected for selecting a first option for adding an additional execution command to the group and a second option for deleting an execution command from the group;

a memory for storing therein definition data of the group related to the changed execution command, when the second mode is selected; and a console-unit-side central processing unit, responsive to an input of a group name during a command input waiting period, for reading all execution commands included in the input group name out of said memory and for causing said display to display those commands, together with their related comments.

14. An exposure apparatus for sequentially exposing, in a step-and-repeat manner, different shot areas of a semiconductor wafer to a radiation beam passed through a mask, to thereby print a pattern of the mask, prepared for manufacture of integrated circuits, on the shot areas of the wafer, said apparatus comprising:

an exposure unit for sequentially exposing the shot areas of the wafer to the radiation beam passed through the mask, said exposure unit comprising:
a mask stage for holding the mask;
a wafer stage for holding the wafer;
a wafer stage driving stage for moving said wafer stage along an X-Y plane;
a Z-axis driving system for moving the wafer held by said wafer stage in a Z-axis direction;
an alignment detecting system for relatively positioning the mask held by said mask stage and the wafer held by said wafer stage, with respect to the X-Y plane;
a Z-axis position detecting system for relatively positioning the mask held by said mask stage and the wafer held by said wafer stage, with respect to the Z-axis direction; p1 an exposure control system for controlling the exposure of the wafer held by said wafer stage to the radiation beam passed through the mask held by said mask stage; and
an exposure-unit-side central processing unit for controlling each of said wafer stage driving system, said Z-axis driving system, said alignment detecting system, said Z-axis position detecting system and said exposure control system, in accordance with at least one of an applied command and an applied parameter, to thereby execute sequential exposures, in the step-and-repeat manner, of the shot areas of the wafer to the radiation beam passed through the mask; and
a console unit for applying, to said exposure-unit-side central processing unit, at least one of a command and a parameter related to the operation of each of said systems of said exposure unit, said console unit comprising:
a display, operable after input of a command for preparation of a job to be executed in said exposure unit, for selecting a first mode for at least one of changing and preparing an operational parameter related to a layout of the wafer to be processed by said exposure unit, a second mode for at least one of changing and preparing an operational parameter related to a process of the wafer to be processed by said exposure unit and a third mode for at least one of changing and preparing an operational parameter related to each shot area of the wafer to be processed by said exposure unit; and
a memory for storing at least one of (i) a layout parameter when said first mode is selected, (ii) a process parameter when said second mode is selected and (iii) a shot parameter when said third mode is selected; and
a console-unit-side central processing unit, responsive to an input of a job name during a command input waiting period, for reading operational parameters corresponding to the input job name out of said memory.

15. An exposure apparatus for sequentially exposing, in a step-and-repeat manner, different shot areas of a semiconductor wafer to be radiation beam passed through a mask, to thereby print a pattern of the mask, prepared for manufacture of integrated circuits, on the shot areas of the wafer, said apparatus comprising:

an exposure unit for sequentially exposing the shot areas of the wafer to the radiation beam passed through the mask, said exposure unit comprising:
a mask stage for holding the mask;
a wafer stage for holding the wafer;
a wafer stage driving system for moving said wafer stage along an X-Y plane;
a Z-axis driving system for moving the wafer held by said wafer stage in a Z-axis direction;
an alignment detecting system for relatively positioning the mask held by said mask stage and the wafer held by said wafer stage, with respect to the X-Y plane;
a Z-axis position detecting system for relatively positioning the mask held by said mask stage and the wafer held by said wafer stage, with respect to the Z-axis direction;
an exposure control system for controlling the exposure of the wafer held by said wafer stage to the radiation beam passed through the mask held by said mask stage; and
an exposure-unit-side-central processing unit for controlling each of said wafer stage driving system, said Z-axis driving system, said alignment detecting system, said Z-axis position detecting system and said exposure control system, in accordance with at least one of an applied command and an applied parameter, to thereby execute sequential exposures, in the step-and-repeat manner, of the shot areas of the wafer to the radiation beam passed through the mask; and
a console unit for applying, to said exposure-unit-side central processing unit, at least one of a command and a parameter related to the operation of each of said systems of said exposure unit, said console unit comprising:
a display, operable upon selection of a map preparing mode for changing an operational parameter of said exposure unit for the exposure of each shot area of the wafer, for displaying a layout of the shot areas of the wafer together with their row number and column numbers;
a memory for storing, in the form of a shot map file, operational parameters set in units of a shot area or in units of a row; and
a console-unit-side central processing unit, responsive to an input of a job file name including a shot map file during a command input waiting period, for reading operational parameters corresponding to the input job file name out of said memory and for causing said display to display a quantity of a predetermined parameter, of the read-out operational parameters, together with the shot layout.

16. An exposure apparatus for sequentially exposing, in a step-and-repeat manner, different shot areas of a semiconductor wafer to a radiation beam passed through a mask, to thereby print a pattern of the mask, prepared for manufacture of integrated circuits, on the shot areas of the wafer, said apparatus comprising:

an exposure unit for sequentially exposing the shot areas of the wafer to the radiation beam passed through the mask, said exposure unit comprising:

a mask stage for holding the mask;

a wafer stage for holding the wafer;

a wafer stage driving system for moving said wafer stage along an X-Y plane;

a Z-axis driving system for moving the wafer held by said wafer stage in a Z-axis direction;

an alignment detecting system for relatively positioning the mask held by said mask stage and the wafer held by said wafer stage, with respect to the X-Y plane;

a Z-axis position detecting system for relatively positioning the mask held by said mask stage and the wafer held by said wafer stage, with respect to the Z-axis direction;

an exposure control system for controlling the exposure of the wafer held by said wafer stage to the radiation beam passed through the mask held by said mask stage; and an exposure-unit-side central processing unit for controlling each of said wafer stage driving system, said Z-axis driving system, said alignment detecting system, said Z-axis position detecting system and said exposure control system, in accordance with at least one of an applied command and an applied parameter, to thereby execute sequential exposures, in the step-and-repeat manner, of the shot areas of the wafer to the radiation beam passed through the mask; and a console unit for applying, to said exposure-unit-side processing unit, at least one of a command and a parameter related to the operation of each of said systems of said exposure unit, said console unit comprising:

a display, operable upon input of a command for changing an operational parameter for said exposure unit in an operator mode, for displaying the operational parameter and a name of a job related to the operational parameter;

a memory for storing the changed operational parameter; and a console-unit-side central processing unit, responsive to an input of a job name during a command input waiting period, for reading operational parameters corresponding to the input job name out of said memory.

17. An exposure apparatus for sequentially exposing, in a step-and-repeat manner, different shot areas of a semiconductor wafer to a radiation beam passed through a mask, to thereby print a pattern of the mask, prepared for manufacture of integrated circuits, on the shot areas of the wafer, said apparatus comprising:

an exposure unit for sequentially exposing the shot areas of the wafer to the radiation beam passed through the mask, said exposure unit comprising:

a mask stage for holding the mask;

a wafer stage for holding the wafer;

a wafer stage driving system for moving said wafer stage along an X-Y plane;

a Z-axis driving system for moving the wafer held by said wafer stage in a Z-axis direction;

an alignment detecting system for relatively positioning the mask held by said mask stage and the wafer held by said wafer stage, with respect to the X-Y plane;

a Z-axis position detecting system for relatively positioning the mask held by said mask stage and the wafer held by said wafer stage, with respect to the Z-axis direction;

an exposure control system for controlling the exposure of the wafer held by said wafer stage to the radiation beam passed through the mask held by said mask stage; and an exposure-unit-side central processing unit for controlling each of said wafer stage driving system, said Z-axis driving system, said alignment detecting system, said Z-axis position detecting system and said exposure control system, in accordance with at least one of an applied command and an applied parameter, to thereby execute sequential exposures, in the step-and-repeat manner, of the shot areas of the wafer to the radiation beam passed through the mask; and a console unit for applying, to said exposure-unit-side central processing unit, at least one of a command and a parameter related to the operation of each of said systems of said exposure unit, said console unit comprising:

a display, operable upon input of a command for initiating an operation of said exposure unit, for displaying a name of a job and parameters, both related to the operation to be initiated;

a memory for storing the parameters; and a console-unit-side central processing unit, responsive to an input of the command during a command input waiting period, for reading the parameters out of said memory.

18. An exposure apparatus for sequentially exposing, in a step-and-repeat manner, different shot areas of a semiconductor wafer to a radiation beam passed through a mask, to thereby print a pattern of the mask, prepared for manufacture of integrated circuits, on the shot areas of the wafer, said apparatus comprising:

an exposure unit for sequentially exposing the shot areas of the wafer to the radiation beam passed through the mask, said exposure unit comprising:

a mask stage for holding the mask;

a wafer stage for holding the wafer;

a wafer stage driving system for moving said wafer stage along an X-Y plane;

a Z-axis driving system for moving the wafer held by said wafer stage in a Z-axis direction;

an alignment detecting system for relatively positioning the mask held by said mask stage and the wafer held by said wafer stage, with respect to the X-Y plane;

a Z-axis position detecting system for relatively positioning the mask held by said mask stage and the wafer held by said wafer stage, with respect to the Z-axis direction;

an exposure control system for controlling the exposure of the wafer held by said wafer stage to the radiation beam passed through the mask held by said mask stage; and an exposure-unit-side central processing unit for controlling each of said wafer stage driving system, said Z-axis driving system , said alignment detecting system, said Z-axis position detecting system and said exposure control system, in accordance with at least one of an applied command and an applied parameter, to thereby execute sequential exposures, in the step-and-repeat manner, of the shot areas of the wafer to the radiation beam passed through the mask; and a console unit for applying, to said exposure-unit-side central processing unit, at least one of a command and a parameter related to the operation of each of said systems of said exposure unit, said console unit comprising:

a display, responsive to designation of a preparation sequence for preparing data related to said exposure unit, for displaying a prompt message for input of a password; and a console-unit-side central processing unit, responsive to input of a correct password, for continuing the preparation sequence, said console-unit-side central processing unit further being responsive to inputs of an incorrect password a predetermined number of times, for discontinuing the preparation sequence.

* * * * *

UNITED STATES PATENT AND TRADEMARK OFFICE
CERTIFICATE OF CORRECTION

PATENT NO. : 5,197,118  Page 1 of 5
DATED : March 23, 1993
INVENTOR(S) : Ryuichi Sato, et al.

It is certified that error appears in the above-indentified patent and that said Letters Patent is hereby corrected as shown below:

IN THE DRAWINGS

FIGURE 12C

Step 160, "POSSWORD PROCESSING" should read --PASSWORD PROCESSING--.

IN THE DISCLOSURE

COLUMN 2

Line 10, "Moreover" should read --Moreover,--; and
Line 14, "In" should read --On--.

COLUMN 3

Line 41, "processing,," should read --processing,--; and
Line 50, "FIG. 18" should read --FIGS. 18--.

COLUMN 5

Line 47, "When" should read --When,--; and
Line 65, "hereinbefore," should read --herein,--.

UNITED STATES PATENT AND TRADEMARK OFFICE
CERTIFICATE OF CORRECTION

PATENT NO. : 5,197,118
DATED : March 23, 1993
INVENTOR(S) : Ryuichi Sato, et al.

It is certified that error appears in the above-indentified patent and that said Letters Patent is hereby corrected as shown below:

COLUMN 6

Line 24, "area 4" should read --area 44--;
    Line 43, " "S1"for " should read --"S1", for--;
and
    Line 63, "depicts" should read --depict--.

COLUMN 8

Line 3, "fetched" should be deleted.

COLUMN 9

Line 21, "of user" should read --user--;
    Line 24, "movement,," should read --movement,--;
and
    Line 25, "etc." should read --etc.)--.

COLUMN 14

Line 45, "directly" should read --directly to--.

COLUMN 15

Line 51, "course" should read --course,--.

COLUMN 16

Line 17, "operation" should read --operation,--.

UNITED STATES PATENT AND TRADEMARK OFFICE
CERTIFICATE OF CORRECTION

PATENT NO. : 5,197,118        Page 3 of 5
DATED : March 23, 1993
INVENTOR(S) : Ryuichi Sato, et al.

It is certified that error appears in the above-indentified patent and that said Letters Patent is hereby corrected as shown below:

COLUMN 19

Line 48, "on to the" should read --on the--.

COLUMN 20

Line 54, "list.," should read --list.--.

COLUMN 22

Line 54, "a parameters," should read --parameters,--.
    Line 55, "parameter" should read --parameters--.

COLUMN 23

Line 34, "area" should read --areas--.

COLUMN 24

Line 38, "step-and-step" should read --step-and-repeat--.

COLUMN 25

Line 36, "an" should read --and--.

COLUMN 26

Line 5, "step-and-rear" should read --step-and-repeat--; and
    Line 18, "layout" should read --a layout--.

UNITED STATES PATENT AND TRADEMARK OFFICE
CERTIFICATE OF CORRECTION

PATENT NO. : 5,197,118  
DATED : March 23, 1993  
INVENTOR(S) : Ryuichi Sato, et al.

It is certified that error appears in the above-indentified patent and that said Letters Patent is hereby corrected as shown below:

COLUMN 27

Line 6, "direction p1 an exposure control system for con-" should read:
--direction
    an exposure control system for con- --;
Line 46, "exposing" should read --exposing,--; and
Line 47, "in," should read --in--.

COLUMN 28

Line 35, "our" should read --out--; and
Line 67, "system" should read --system,--.

COLUMN 29

Line 24, "AN" should read --An--.

COLUMN 31

Line 30, "direction p1 an exposure control system for con-" should read
--direction
    an exposure control system for--.

UNITED STATES PATENT AND TRADEMARK OFFICE
CERTIFICATE OF CORRECTION

PATENT NO. : 5,197,118
DATED : March 23, 1993
INVENTOR(S) : Ryuichi Sato, et al.

It is certified that error appears in the above-indentified patent and that said Letters Patent is hereby corrected as shown below:

COLUMN 32

Line 5, "be" should read --a--; and
Line 50, "number" should read --numbers--.

COLUMN 34

Line 63, "system ," should read --system,--.

Signed and Sealed this

Twenty-second Day of February, 1994

Attest:

BRUCE LEHMAN

Attesting Officer    Commissioner of Patents and Trademarks